United States Patent
Mori

(10) Patent No.: US 11,336,252 B2
(45) Date of Patent: May 17, 2022

(54) RADIO FREQUENCY FILTER, MULTIPLEXER, RADIO FREQUENCY FRONT END CIRCUIT, AND COMMUNICATION APPARATUS

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/126,178

(22) Filed: Dec. 18, 2020

(65) Prior Publication Data
US 2021/0104996 A1  Apr. 8, 2021

Related U.S. Application Data

(63) Continuation of application No. PCT/JP2019/021222, filed on May 29, 2019.

(30) Foreign Application Priority Data

Jul. 3, 2018 (JP) .............................. JP2018-126478

(51) Int. Cl.
  *H03H 7/01* (2006.01)
  *H04B 1/00* (2006.01)
(52) U.S. Cl.
  CPC ........ *H03H 7/0115* (2013.01); *H03H 7/1783* (2013.01); *H04B 1/0057* (2013.01)
(58) Field of Classification Search
  CPC .... H03H 7/0115; H03H 7/175; H03H 7/1775; H03H 9/542

USPC .................................................. 333/175, 185
  See application file for complete search history.

(56) References Cited

U.S. PATENT DOCUMENTS

| | | | |
|---|---|---|---|
| 2006/0145782 A1* | 7/2006 | Liu | ......................... H03H 7/463 333/132 |
| 2011/0074521 A1* | 3/2011 | Chernyakov | ....... H01P 1/20345 333/134 |
| 2012/0313731 A1 | 12/2012 | Burgener et al. | |
| 2015/0002240 A1* | 1/2015 | Reiha | ...................... H03H 9/52 333/132 |
| 2017/0141752 A1 | 5/2017 | Hino | |
| 2017/0264268 A1 | 9/2017 | Schmidhammer | |

(Continued)

FOREIGN PATENT DOCUMENTS

| JP | H10-0335965 A | 12/1998 |
|---|---|---|
| JP | 2006-246124 A | 9/2006 |
| JP | 2014-502803 A | 2/2014 |

(Continued)

OTHER PUBLICATIONS

International Search Report of PCT/JP2019/021222 dated Jul. 2, 2019.
Written Opinion of PCT/JP2019/021222 dated Jul. 2, 2019.

*Primary Examiner* — Rakesh B Patel
(74) *Attorney, Agent, or Firm* — Pearne & Gordon LLP

(57) ABSTRACT

A filter (10) includes two capacitors (C1a and C1b) that are connected in series on a path connecting an input terminal (101a) and an output terminal (102a), an inductor (L2) that is connected in parallel with a series circuit including the two capacitors (C1a and C1b), and a parallel-arm resonator (P1) that is connected between the ground and a node (N) between the two capacitors (C1a and C1b) on the path.

17 Claims, 38 Drawing Sheets

(56) References Cited

U.S. PATENT DOCUMENTS

2018/0019730 A1    1/2018  Takeuchi et al.
2019/0140620 A1    5/2019  Inate

FOREIGN PATENT DOCUMENTS

| JP | 2017-528013 A | 9/2017 |
| JP | 2018-019392 A | 2/2018 |
| WO | 2005/088832 A1 | 9/2005 |
| WO | 2016/042990 A1 | 3/2016 |
| WO | 2018/003538 A1 | 1/2018 |

* cited by examiner freq (500.0 MHz to 3.000 GHz)

m1
freq=1.710GHz
ρ/θ=0.887/-84.005
impedance=Z0*(0.133-j1.102)

m2
freq=1.920GHz
ρ/θ=0.913/-130.717
impedance=Z0*(0.055-j0.458)

m3
freq=2.300GHz
ρ/θ=0.510/81.832
impedance=Z0*(0.663+j0.906)

m4
freq=2.690GHz
ρ/θ=0.461/-108.441
impedance=Z0*(0.524-j0.581)

freq (500.0 MHz to 3.000 GHz)

m1
freq=1.710GHz
ρ/θ=0.933/-12.233
impedance=Z0*(2.781-j8.426)

m2
freq=1.920GHz
ρ/θ=0.947/-45.234
impedance=Z0*(0.184-j2.388)

m3
freq=2.300GHz
ρ/θ=0.197/-166.407
impedance=Z0*(0.676-j0.065)

m4
freq=2.690GHz
ρ/θ=0.460/-65.660
impedance=Z0*(0.947-j1.007)

EXAMPLE 2

EXAMPLE 3

EXAMPLE 5

RADIO FREQUENCY FILTER, MULTIPLEXER, RADIO FREQUENCY FRONT END CIRCUIT, AND COMMUNICATION APPARATUS

CROSS REFERENCE TO RELATED APPLICATION

This is a continuation of International Application No. PCT/JP2019/021222 filed on May 29, 2019 which claims priority from Japanese Patent Application No. 2018-126478 filed on Jul. 3, 2018. The contents of these applications are incorporated herein by reference in their entireties.

BACKGROUND OF THE DISCLOSURE

Field of the Disclosure

The present disclosure relates to a radio frequency filter, a multiplexer, a radio frequency front end circuit, and a communication apparatus.

Description of the Related Art

Ladder filters including acoustic wave resonators have been proposed (see, for example, Patent Document 1). As disclosed in Patent Document 1, with acoustic wave resonators arranged in a ladder shape, a filter having a sharp attenuation characteristic can be implemented.

Patent Document 1: Japanese Unexamined Patent Application Publication No. 10-335965

BRIEF SUMMARY OF THE DISCLOSURE

A pass band of a ladder filter is determined based on a band width between the resonant frequency and the anti-resonant frequency of each of a plurality of acoustic wave resonators forming the filter (called a resonant band width). That is, a pass band of the ladder filter is limited by the resonant band width of each of a plurality of acoustic wave resonators. For example, although a pass band wider than the resonant band width is desired, the pass band is limited by the resonant band width, and insertion loss in the pass band increases.

Thus, an object is to provide a radio frequency filter and the like with a sharp attenuation characteristic and a low-loss pass band that is not limited by a resonant band width of an acoustic wave resonator.

To achieve the above object, a radio frequency filter according to an aspect of the present disclosure includes two first impedance elements that are connected in series on a path connecting an input terminal and an output terminal, a second impedance element that is connected in parallel with a series circuit including the two first impedance elements, and a parallel-arm resonator that is connected between a ground and a node between the two first impedance elements on the path. Each of the first impedance elements is one of a capacitor and an inductor, and the second impedance element is the other one of the capacitor and the inductor.

A multiplexer according to an aspect of the present disclosure includes a plurality of filters each including a first filter and a second filter as the radio frequency filters described above. Input terminals or output terminals of the plurality of filters are connected to a common terminal.

A radio frequency front end circuit according to an aspect of the present disclosure includes the multiplexer described above, a switch that is connected directly or indirectly to the multiplexer, and an amplifying circuit that is connected directly or indirectly to the multiplexer.

A communication apparatus according to an aspect of the present disclosure includes an RF signal processing circuit that processes a radio frequency signal transmitted and received at an antenna element and the radio frequency front end circuit described above that transmits the radio frequency signal between the antenna element and the RF signal processing circuit.

According to the present disclosure, a radio frequency filter and the like with a sharp attenuation characteristic and a low-loss pass band that is not limited by a resonant band width of an acoustic wave resonator can be implemented.

BRIEF DESCRIPTION OF THE SEVERAL VIEWS OF THE DRAWINGS

FIG. 34 is a graph indicating bandpass characteristics of the filter according to the modification of Example 1 when a switch is turned off and turned on.

DETAILED DESCRIPTION OF THE DISCLOSURE

Figure 1:
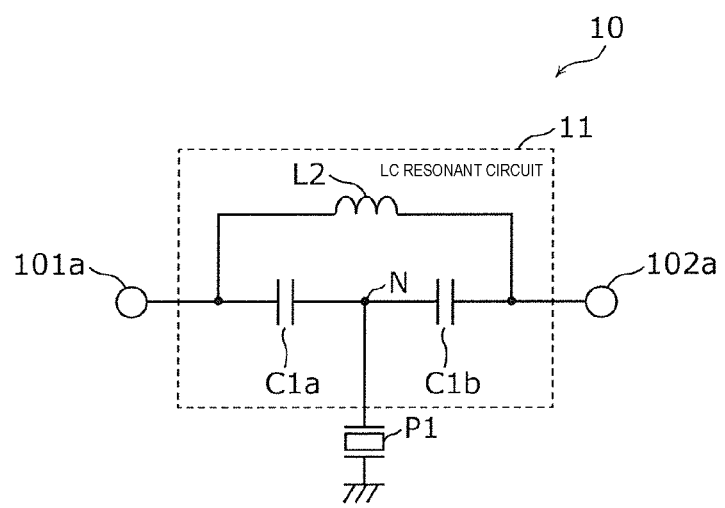
FIG. 1 is a circuit configuration diagram of a filter according to Example 1.

Hereinafter, embodiments of the present disclosure will be explained in detail with reference to the drawings. The embodiments described herein illustrate either general or specific examples. Numerical values, shapes, materials, components, and arrangement and modes of connection of the components described in the embodiments are merely examples, and are not intended to limit the present disclosure. Components in the embodiments, except those described in the independent claims, will be explained as optional components. The sizes or the ratios between the sizes of the components illustrated in the drawings are not strictly correct. Furthermore, in the drawings, the same signs are assigned to substantially the same components, and redundant explanation may be omitted or simplified. Furthermore, in the embodiments described below, the term "being connected" not only represents being directly connected but also includes being electrically connected with other elements or the like interposed therebetween.

First Embodiment

Hereinafter, configurations and bandpass characteristics of a radio frequency filter and a multiplexer according to a first embodiment will be described with reference to Examples 1 to 6. Furthermore, configurations and bandpass characteristics of a radio frequency filter and a multiplexer to be compared with each of the Examples will be described with reference to Comparative Examples 1 to 4.

A configuration of a radio frequency filter according to the first embodiment that is common in the Examples will be described first, and then the Examples will be described. Hereinafter, a radio frequency filter will also be referred to as a filter.

A filter according to the first embodiment includes two first impedance elements that are connected in series on a path connecting an input terminal and an output terminal, a second impedance element that is connected in parallel with a series circuit including the two first impedance elements, and a parallel-arm resonator that is connected between the ground and a node between the two first impedance elements on the path. Each of the first impedance elements is one of a capacitor and an inductor, and the second impedance element is the other one of the capacitor and the inductor. That is, in the case where the first impedance elements are capacitors, the second impedance element is an inductor. In contrast, in the case where the first impedance elements are inductors, the second impedance element is a capacitor. With such a relationship between the first impedance elements and the second impedance element, the two first impedance elements and the second impedance element form an LC resonant circuit (specifically, an LC parallel resonant circuit). Furthermore, by appropriately setting element values (capacitance value and inductance value) of the two first impedance elements and the second impedance element, the LC resonant circuit may function as a high pass filter or a low pass filter.

A capacitor according to the present disclosure represents an element exhibiting capacitive characteristics over the entire band as an ideal element and does not include an acoustic wave resonator. This is because an acoustic wave resonator is an element exhibiting inductive characteristics in a band between the resonant frequency and the anti-resonant frequency and exhibiting capacitive characteristics in other bands, not an element exhibiting capacitive characteristics over the entire band.

Hereinafter, a filter assumed to have the configuration described above and a multiplexer that includes the filter will be described.

Example 1

FIG. 1 is a circuit configuration diagram of a filter 10 according to Example 1.

The filter 10 includes capacitors C1a and C1b, an inductor L2, and a parallel-arm resonator P1.

The capacitors C1a and C1b are two first impedance elements that are connected in series on a path connecting a terminal 101a and a terminal 102a. Hereinafter, in Examples and Comparative Examples, explanation will be provided by defining the terminal 101a as an input terminal and defining the terminal 102a as an output terminal. However, the terminal 101a may be an output terminal, and the terminal 102a may be an input terminal.

The inductor L2 is a second impedance element that is connected in parallel with a series circuit including the capacitors C1a and C1b. Specifically, the inductor L2 is connected between a connection point between the capacitor C1a and the terminal 101a and a connection point between the capacitor C1b and the terminal 102a.

In the filter 10, the capacitors C1a and C1b and the inductor L2 form an LC resonant circuit 11. Also, in other Examples described below, two first impedance elements, each of which is one of a capacitor and an inductor, and a second impedance element, which is the other one of the capacitor and the inductor, form an LC resonant circuit. However, a broken line surrounding the first impedance elements and the second impedance element and the word "LC resonant circuit" will be omitted.

The parallel-arm resonator P1 is an acoustic wave resonator that is connected between the ground and a node N between the capacitor C1a and the capacitor C1b on the path connecting the terminal 101a and the terminal 102a.

The acoustic wave resonator is a resonator using acoustic waves and may be, for example, a resonator using SAW (Surface Acoustic Wave), a resonator using BAW (Bulk Acoustic Wave), an FBAR (Film Bulk Acoustic Resonator), or the like. SAWs include boundary waves as well as surface acoustic waves. In this example, an acoustic wave resonator is represented by a SAW resonator. Accordingly, an acoustic wave resonator forming the filter 10 is configured including an IDT (InterDigital Transducer) electrode formed on a substrate having piezoelectricity. Thus, a compact and low-profile filter circuit with a sharp attenuation characteristic can be implemented. A substrate having piezoelectricity is a substrate having piezoelectricity at least on its surface. The substrate includes, for example, a multilayer body including a piezoelectric thin film on its surface, a film with an acoustic velocity different from that of the piezoelectric thin film, and a supporting substrate. Furthermore, the substrate may include, for example, a multilayer body including a supporting substrate with high acoustic velocity and a piezoelectric thin film formed on the supporting substrate with high acoustic velocity, a multilayer body including a supporting substrate with high acoustic velocity, a film with low acoustic velocity formed on the supporting substrate with high acoustic velocity, and a piezoelectric thin film formed on the film with low acoustic velocity, or a multilayer body including a supporting substrate, a film with high acoustic velocity formed on the supporting substrate, a film with low acoustic velocity formed on the film with high acoustic velocity, and a piezoelectric thin film formed on the film with low acoustic velocity. The entire substrate may have piezoelectricity. The same applies to acoustic wave resonators (series-arm resonator and parallel-arm resonator) described in Examples 2 to 6. Thus, such explanation will be omitted in Examples 2 to 6.

As illustrated in FIG. 1, the present disclosure is characterized in that the parallel-arm resonator P1 is connected between the capacitors C1a and C1b (two first impedance elements) forming the LC resonant circuit 11. Principles of this configuration will be explained with reference to FIGS. 2A to 4B.

[Principles]

FIGS. 2A to 4B are diagrams for explaining the principles of the present disclosure.

Figure 2A:
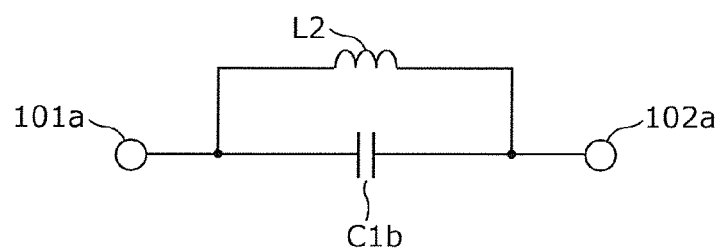
FIG. 2A is a diagram for explaining a principle of the present disclosure.
Figure 2B:
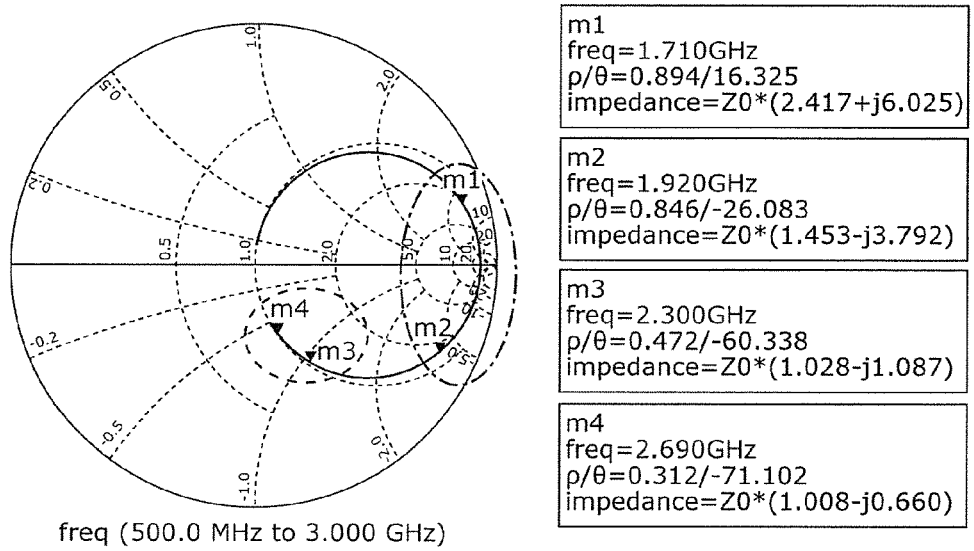
FIG. 2B is a diagram for explaining a principle of the present disclosure.

FIG. 2A is a diagram illustrating a filter (LC resonant circuit) that includes the capacitor C1b and the inductor L2 in a configuration of the filter 10, in which the capacitor C1a and the parallel-arm resonator P1 are removed. FIG. 2B is a Smith chart indicating impedance characteristics of the filter illustrated in FIG. 2A.

Figure 3A:
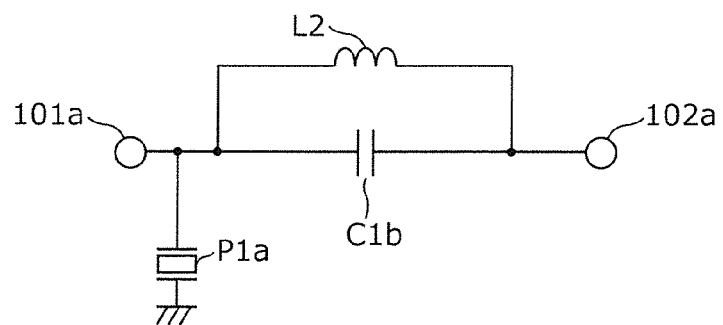
FIG. 3A is a diagram for explaining a principle of the present disclosure.
Figure 3B:
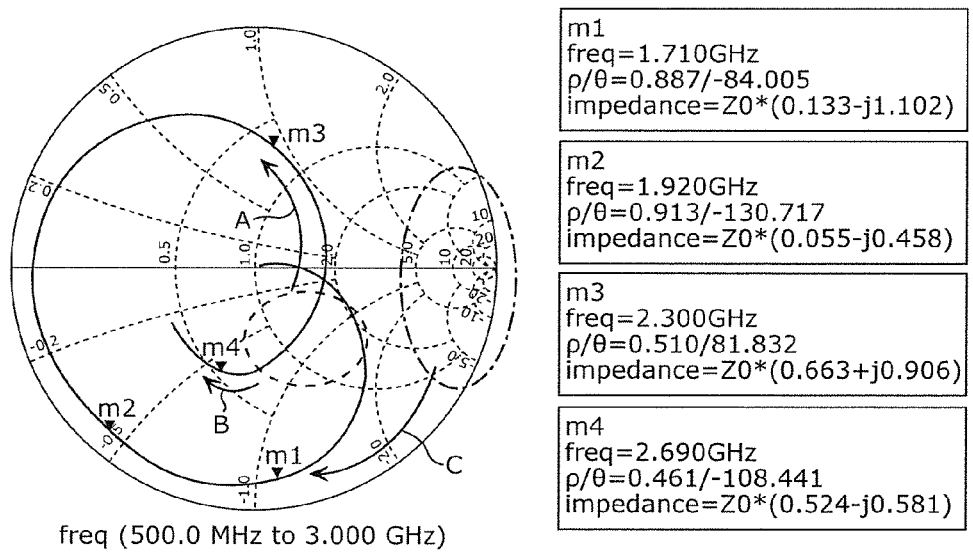
FIG. 3B is a diagram for explaining a principle of the present disclosure.
Figure 4A:
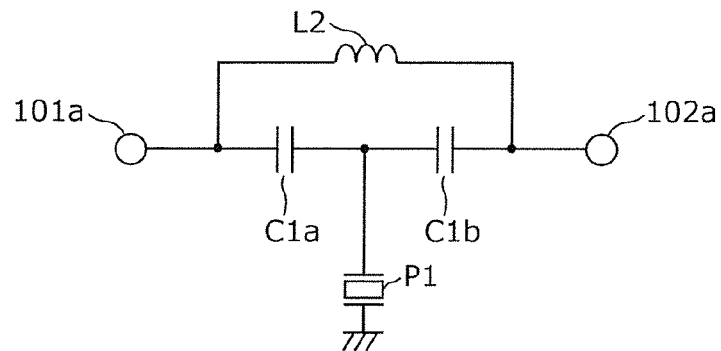
FIG. 4A is a diagram for explaining a principle of the present disclosure.
Figure 4B:
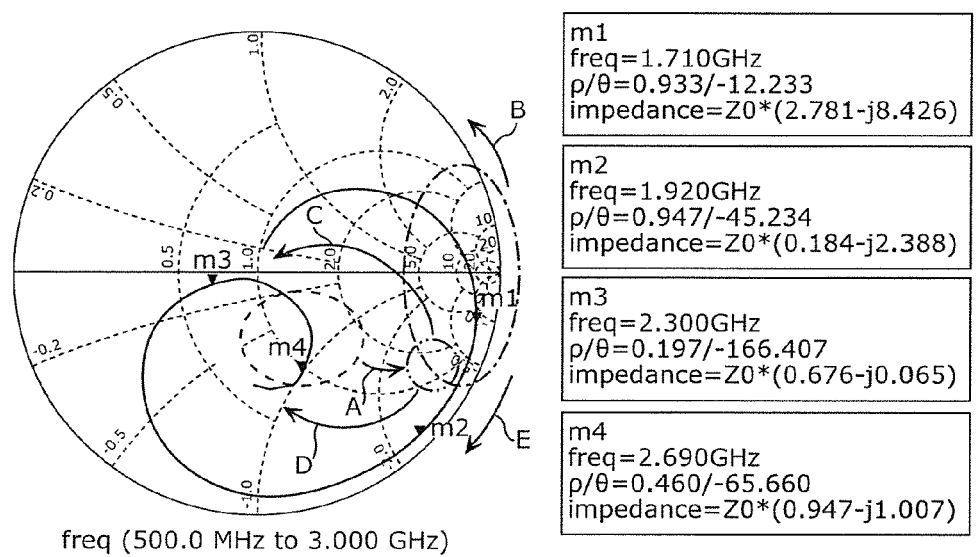
FIG. 4B is a diagram for explaining a principle of the present disclosure.

In Smith charts of FIGS. 2B, 3B, and 4B indicating impedance characteristics, markers are provided near a lower frequency end and near a higher frequency end of a required pass band and near a lower frequency end and near a higher frequency end of a required attenuation band. Furthermore, frequency, size ρ of a reflection coefficient and phase θ, and impedance (a coefficient Z0 represents, for example, 50Ω) at markers m* in the graph (* represents a numerical value subsequent to m in the graph) are illustrated on the right of the Smith charts indicating impedance characteristics. For example, the required pass band is from 2300 MHz (frequency at the marker m3) to 2690 MHz (frequency at the marker m4), and the required attenuation band is from 1710 MHz (frequency at the marker m1) to 1920 MHz (frequency at the marker m2).

For example, the filter illustrated in FIG. 2A functions as a high pass filter to achieve the required pass band and attenuation band. As illustrated in FIG. 2B, impedance near the lower frequency end and near the higher frequency end of the pass band is close to 50Ω, and impedance near the lower frequency end and near the higher frequency end of the attenuation band is close to open. On the Smith chart illustrated in FIG. 2B, a region near the lower frequency end and near the higher frequency end of the pass band (markers m3 and m4) is surrounded by a broken-line circle, and a region near the lower frequency end and near the higher frequency end of the attenuation band (markers m1 and m2) is surrounded by a dashed-dotted line circle.

The filter illustrated in FIG. 2A represents the LC resonant circuit including the capacitor C1b and the inductor L2. Thus, it is difficult for the filter to achieve a sharp attenuation characteristic. However, by adding an acoustic wave resonator having a sharp attenuation pole, a sharp attenuation characteristic may be achieved.

FIG. 3A illustrates a filter including the capacitor C1b, the inductor L2, and a parallel-arm resonator P1a. The filter is obtained by adding the parallel-arm resonator P1a to the configuration of the filter illustrated in FIG. 2A. The parallel-arm resonator P1a is connected between the ground and a node between the terminal 101a and a connection point between the capacitor C1b and the inductor L2, which are connected in parallel.

For example, the parallel-arm resonator P1a is a resonator with a resonant frequency of 2200 MHz and an anti-resonant frequency of 2500 MHz. Thus, the parallel-arm resonator P1a exhibits inductive characteristics in a resonant band width (from 2200 MHz to 2500 MHz) and exhibits capacitive characteristics in other bands.

FIG. 3B is a Smith chart indicating impedance characteristics of the filter illustrated in FIG. 3A. In FIG. 3B, to indicate changes in the impedance characteristics caused by adding the parallel-arm resonator P1a to the filter illustrated in FIG. 2A, a dashed-dotted line circle is provided at the same position as the positions of the markers m1 and m2 illustrated in FIG. 2B, and a broken-line circle is provided at the same position as the positions of the markers m3 and m4 illustrated in FIG. 2B.

The frequency at the marker m3, which is near the lower frequency end of the pass band, is 2300 MHz. Thus, by adding the parallel-arm resonator P1a, which exhibits inductive characteristics at the corresponding frequency, the position of the marker m3 rotates anticlockwise (a direction represented by an arrow A) from the position of the broken-line circle. In contrast, the frequency at the marker m4, which is near the higher frequency end of the pass band, is 2690 MHz. Thus, by adding the parallel-arm resonator P1a, which exhibits capacitive characteristics at the corresponding frequency, the position of the marker m4 rotates clockwise (a direction represented by an arrow B) from the position of the broken-line circle. As described above, the impedance at the frequency near the lower frequency end of the pass band and the impedance at the frequency near the higher frequency end of the pass band rotate in different directions. Thus, in a frequency range from 2300 MHz to 2690 MHz, which is the pass band, a region that deviates from the center (50Ω) of the Smith chart increases, and insertion loss in the pass band thus increases.

Furthermore, the frequency at the marker m1, which is near the lower frequency end of the attenuation band, is 1710 MHz, and the frequency at the marker m2, which is the higher frequency end of the attenuation band, is 1920 MHz. Thus, by adding the parallel-arm resonator P1a, which exhibits capacitive characteristics at these frequencies, the positions of the markers m1 and m2 rotate clockwise (a direction represented by an arrow C) from the position of the dashed-dotted line circle. As described above, a frequency range from 1710 MHz to 1920 MHz, which is the attenuation band, deviates from the open position of the Smith chart, and the attenuation characteristic thus degrades.

Accordingly, when an acoustic wave resonator is simply added, the bandpass characteristics degrade, and there is a need to devise a method for adding an acoustic wave resonator or the like. Thus, an inventor of the present application has found out that an acoustic wave resonator or the like is added, as illustrated in FIG. 4A. FIG. 4A is a diagram illustrating a filter in which the capacitor C1a is connected in series with the capacitor C1b in the configuration of the filter illustrated in FIG. 2A and the parallel-arm resonator P1 is connected between the ground and the node between the capacitor C1a and the capacitor C1b. Excellent bandpass characteristics can be achieved by adding an acoustic wave resonator or the like as described above. A principle of a achieving excellent bandpass characteristics will be examined with reference to FIG. 4B.

FIG. 4B is a Smith chart indicating impedance characteristics of the filter illustrated in FIG. 4A. In FIG. 4B, to indicate changes in the impedance characteristics caused by adding the capacitor C1a and the parallel-arm resonator P1 (specifically, the capacitor C1a and the parallel-arm resonator P1 are added in this order) to the filter illustrated in FIG. 2A, a dashed-dotted line circle is provided at the same position as the positions of the markers m1 and m2 illustrated in FIG. 2B, and a broken-line circle is provided at the same position as the positions of the markers m3 and m4 illustrated in FIG. 2B.

As with the parallel-arm resonator P1a, the parallel-arm resonator P1 is a resonator with a resonant frequency of 2200 MHz and an anti-resonant frequency of 2500 MHz. Thus, the parallel-arm resonator P1 exhibits inductive characteristics in the resonant band width (from 2200 MHz to 2500 MHz) and exhibits capacitive characteristics in other bands.

First, changes in impedance in the case where the capacitor C1a is connected in series with the capacitor C1b in the configuration of the filter illustrated in FIG. 2A will be explained.

By connecting the capacitor C1a, which exhibits capacitive characteristics over the entire band as an ideal element, to the capacitor C1b in series, the position of each marker rotates anticlockwise. Specifically, the positions of the markers m3 and m4 rotate in the direction represented by the arrow A from the position of the broken-line circle and move close to the position of a dashed-two dotted line circle. The positions of the markers m1 and m2 rotate in the direction represented by the arrow B from the position of the dashed-dotted line circle. The positions of the markers m1 and m2 are originally located near an open position and do not move largely even when the capacitor C1a is added. Thus, the positions of the markers m1 and m2 after moving from the position of the dashed-dotted line circle are not illustrated, unlike the dashed-two dotted line circle.

Next, changes in the impedance in the case where the capacitor C1a is connected in series with the capacitor C1b and then the parallel-arm resonator P1 is connected between the capacitor C1a and the capacitor C1b will be explained.

The frequency at the marker m3, which is near the lower frequency end of the pass band, is 2300 MHz. Thus, by adding the parallel-arm resonator P1, which exhibits inductive characteristics at the corresponding frequency, the position of the marker m3 rotates anticlockwise (the direction represented by the arrow C) from the position of the dashed-two dotted line circle. In contrast, the frequency at the marker m4, which is near the higher frequency end of the pass band, is 2690 MHz. Thus, by adding the parallel-arm resonator P1, which exhibits capacitive characteristics at the corresponding frequency, the position of the marker m4 rotates clockwise (a direction represented by an arrow D) from the position of the dashed-two dotted line circle. It is considered that, because the positions of the markers m3 and m4 that are located within the broken-line circle in the state of the filter illustrated in FIG. 2A are rotated in the direction represented by the arrow A by the capacitor C1a, by rotating the markers m3 and m4 by the parallel-arm resonator P1 from the position of the dashed-two dotted line circle after the rotation, the positions of the markers m3 and m4 are moved closer to the center of the Smith chart. Thus, an increase in the insertion loss in the pass band can be suppressed. The capacitance value of the capacitor C1a (that is, the amount of rotation in the direction represented by the arrow A) is adjusted such that the impedances at the markers m3 and m4 after addition of the parallel-arm resonator P1 (that is, in the pass band) are located near the center of the Smith chart.

Furthermore, the frequency at the marker m1, which is near the lower frequency end of the attenuation band, is 1710 MHz, and the frequency at the marker m2, which is near the higher frequency end of the attenuation band, is 1920 MHz. Thus, by adding the parallel-arm resonator P1, which exhibits capacitive characteristics at these frequencies, the positions of the markers m1 and m2 rotate clockwise (a direction represented by an arrow E) from the position of the dashed-dotted line circle. Because the positions of the markers m1 and m2 that are located within the dashed-dotted line circle in the state of the filter illustrated in FIG. 2A are rotated in the direction represented by the arrow B by the capacitor C1a, even if the markers m1 and m2 are rotated in the direction represented by the arrow E by the parallel-arm resonator P1 from the position after the rotation, the markers m1 and m2 are not moved away from an open position of the Smith chart. Thus, degradation in the attenuation characteristics can be suppressed.

With the principles described above, it is considered that excellent bandpass characteristics can be achieved by connecting a parallel-arm resonator between the ground and a position between the two first impedance elements (in this example, the capacitors C1a and C1b) in the LC resonant circuit, which includes the two first impedance elements and the second impedance element (in this example, the inductor L2).

Bandpass Characteristics of Filter According to Example 1

Next, bandpass characteristics of the filter 10 according to Example 1 will be explained by comparing it with Comparative Examples 1 and 2.

Figure 5:
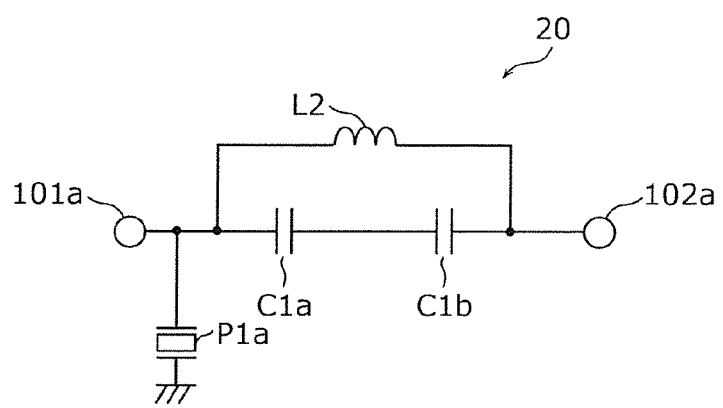
FIG. 5 is a circuit configuration diagram of a filter according to Comparative Example 1.

FIG. 5 is a circuit configuration diagram of a filter 20 according to Comparative Example 1.

The filter 20 according to Comparative Example 1 is different from the filter 10 according to Example 1 in the position where a parallel-arm resonator is connected. The other features are the same as those of the filter 10, and explanation for those features will be omitted.

In the filter 20, the parallel-arm resonator P1a is connected between the ground and a node between the terminal 101a and the LC resonant circuit including the capacitors C1a and C1b and the inductor L2. That is, in the filter 20, the parallel-arm resonator P1a is not connected between the capacitor C1a and the capacitor C1b, unlike Example 1. The filter 20 has a configuration similar to that of the filter illustrated in FIG. 3A.

Figure 6:
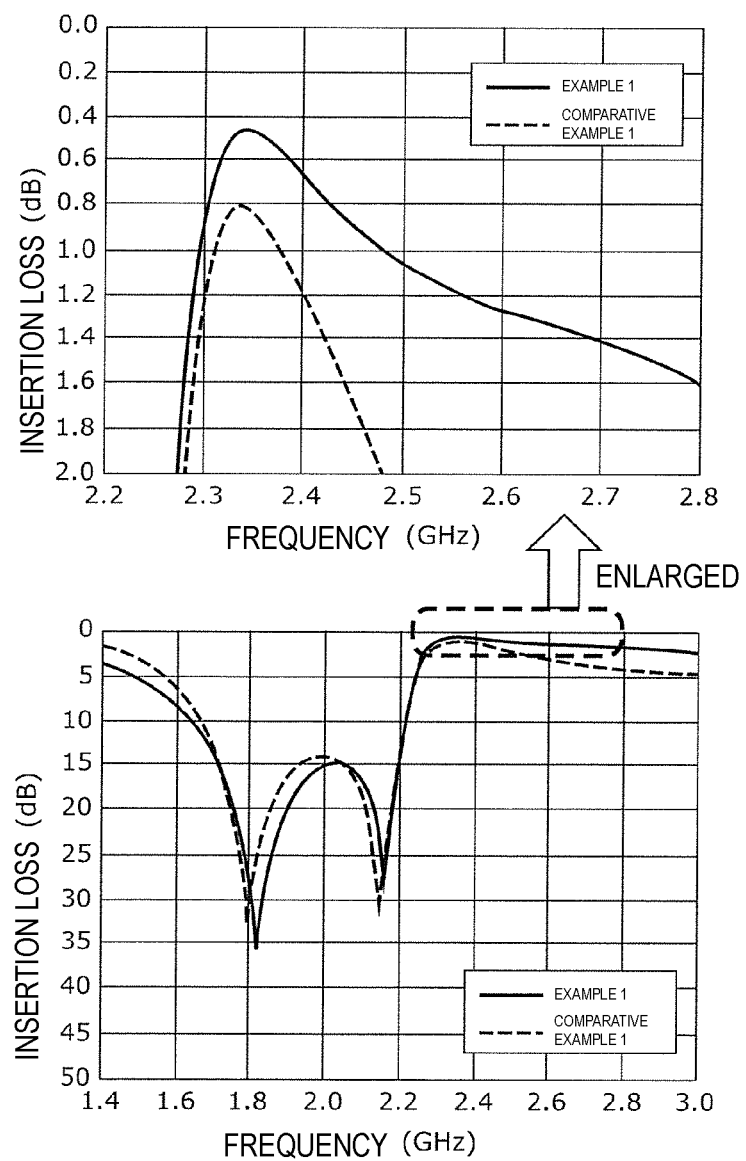
FIG. 6 includes graphs indicating a comparison between bandpass characteristics of the filter according to Example 1 and bandpass characteristics of the filter according to Comparative Example 1.

FIG. 6 includes graphs indicating a comparison between the bandpass characteristics of the filter 10 according to Example 1 and the bandpass characteristics of the filter 20 according to Comparative Example 1. An upper graph in FIG. 6 is obtained by enlarging a region around a broken-line circle in a lower graph. In other graphs indicating bandpass characteristics, the same applies to a part in which "enlarged" is provided next to a broken-line circle. In FIG. 6, solid lines represent the bandpass characteristics of the filter 10 according to Example 1, and broken lines represent the bandpass characteristics of the filter 20 according to Comparative Example 1. The graphs in FIG. 6 indicate bandpass characteristics in the case where the filters 10 and 20 are designed to function as high pass filters.

The filters 10 and 20 each include an acoustic wave resonator and each have a sharp attenuation characteristic due to a sharp attenuation pole by the acoustic wave resonator, as illustrated in FIG. 6. Meanwhile, the filter 10 is able to suppress an increase in insertion loss in the pass band (from 2300 MHz to 2690 MHz), compared to the filter 20. Specifically, at 2300 MHz, compared to the insertion loss of the filter 20, which is 1.191 dB, the insertion loss of the filter 10 is as small as 0.838 dB. Furthermore, at 2690 MHz, compared to the insertion loss of the filter 20, which is 4.216 dB, the insertion loss of the filter 10 is as small as 1.391 dB.

Figure 7:
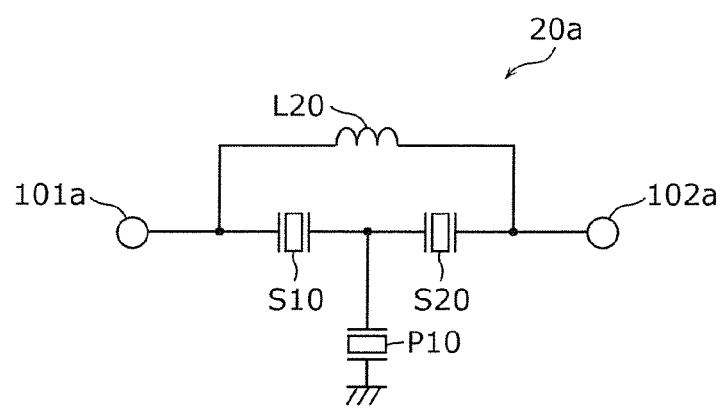
FIG. 7 is a circuit configuration diagram of a filter according to Comparative Example 2.

FIG. 7 is a circuit configuration diagram of a filter 20a according to Comparative Example 2.

The filter 20a according to Comparative Example 2 includes series-arm resonators S10 and S20, an inductor L20, and a parallel-arm resonator P10.

The series-arm resonators S10 and S20 are connected in series on a path connecting the terminal 101a and the terminal 102a.

The inductor L20 is connected in parallel with a series circuit including the series-arm resonators S10 and S20. Specifically, the inductor L20 is connected between a connection point between the series-arm resonator S10 and the terminal 101a and a connection point between the series-arm resonator S20 and the terminal 102a.

The parallel-arm resonator P10 is an acoustic wave resonator that is connected between the ground and a node between the series-arm resonator S10 and the series-arm resonator S20 on the path connecting the terminal 101a and the terminal 102a.

The filter 20a according to Comparative Example 2 is different from the filter 10 according to Example 1 in that the series-arm resonators S10 and S20 are connected in place of the two capacitors C1a and C1b and the filter is a ladder filter in which acoustic wave resonators are arranged in a ladder shape. Element parameters for the series-arm resonators S10 and S20, the inductor L20, and the parallel-arm resonator P10 are adjusted so that the filter 20a has a pass band equivalent to that of the filter 10.

An acoustic wave resonator exhibits capacitive characteristics in a frequency region other than a band between the resonant frequency and the anti-resonant frequency and may also be used as a substitute for a capacitor. That is, a function of the filter 10 according to Example 1 may be implemented by the filter 20a according to Comparative Example 2. However, a pass band of a ladder filter is limited by the resonant band width of each acoustic wave resonator. Thus, by taking Comparative Example 2 as a comparison target to be compared with Example 1, the degree of excellence of the bandpass characteristics of a filter according to the present disclosure compared to a ladder filter can be confirmed.

Figure 8A:
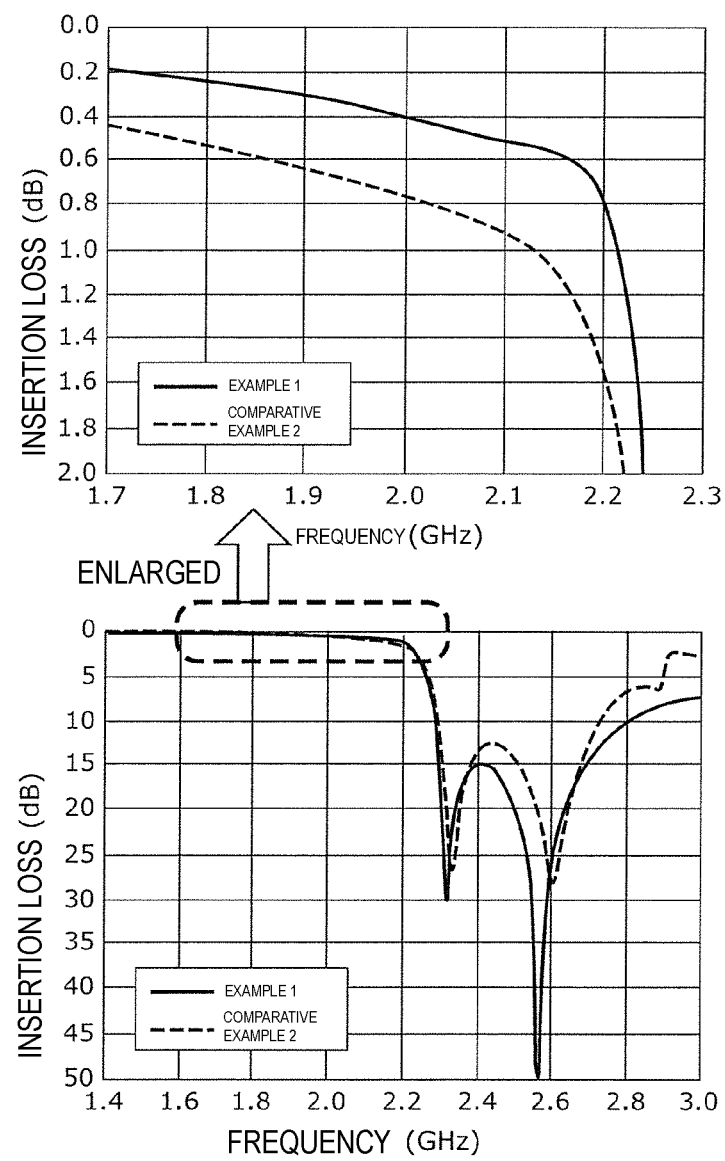
FIG. 8A includes graphs indicating a comparison between bandpass characteristics of a filter (low pass filter) according to Example 1 and bandpass characteristics of a filter (low pass filter) according to Comparative Example 2.

FIG. 8A includes graphs indicating a comparison between bandpass characteristics of the filter 10 (low pass filter) according to Example 1 and bandpass characteristics of the filter 20a (low pass filter) according to Comparative Example 2. In FIG. 8A, solid lines represent the bandpass characteristics of the filter 10 according to Example 1, and broken lines represent the bandpass characteristics of the filter 20a according to Comparative Example 2.

The filter 10 and the filter 20a each include an acoustic wave resonator and each have a sharp attenuation characteristic due to a sharp attenuation pole by the acoustic wave resonator, as illustrated in FIG. 8A. Meanwhile, the filter 10 is able to suppress an increase in insertion loss in the pass band, compared to the filter 20a. Specifically, at 2200 MHz, compared to the insertion loss of the filter 20a, which is 1.561 dB, the insertion loss of the filter 10 is as small as 0.792 dB.

Figure 8B:
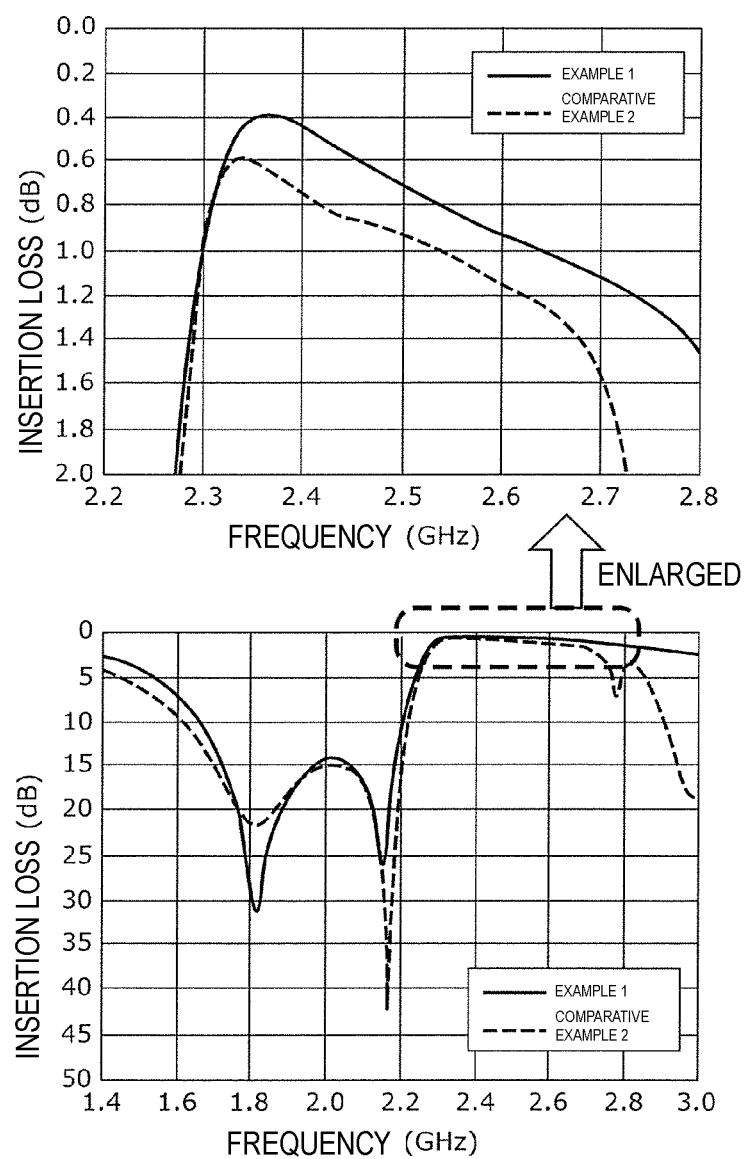
FIG. 8B includes graphs indicating a comparison between bandpass characteristics of a filter (high pass filter) according to Example 1 and bandpass characteristics of a filter (high pass filter) according to Comparative Example 2.

FIG. 8B includes graphs indicating a comparison between bandpass characteristics of the filter 10 (high pass filter) according to Example 1 and bandpass characteristics of the filter 20a (high pass filter) according to Comparative Example 2. In FIG. 8B, solid lines represent the bandpass characteristics of the filter 10 according to Example 1, and broken lines represent the bandpass characteristics of the filter 20a according to Comparative Example 2.

The filter 10 and the filter 20a each include an acoustic wave resonator and each have a sharp attenuation characteristic due to a sharp attenuation pole by the acoustic wave resonator, as illustrated in FIG. 8B. Meanwhile, the filter 10 is able to suppress an increase in insertion loss in the pass band (from 2300 MHz to 2690 MHz), compared to the filter 20a. Specifically, at 2300 MHz, compared to the insertion loss of the filter 20a, which is 0.94 dB, the insertion loss of the filter 10 is as small as 0.922 dB. Furthermore, at 2690 MHz, compared to the insertion loss of the filter 20a, which is 1.483 dB, the insertion loss of the filter 10 is as small as 1.1 dB.

As is clear from the above, the bandpass characteristics of the ladder filter including acoustic wave resonators in place of the capacitors C1a and C1b degrade. That is, in the present disclosure, by not providing acoustic wave resonators in place of capacitors in an LC resonant circuit, degradation in the bandpass characteristics can be suppressed.

As described above, the filter 10 with a sharp attenuation characteristic and a low-loss pass band that is not limited by a resonant band width of an acoustic wave resonator (for example, 300 MHz etc.), unlike a ladder filter, can be implemented.

Example 2

Figure 9:
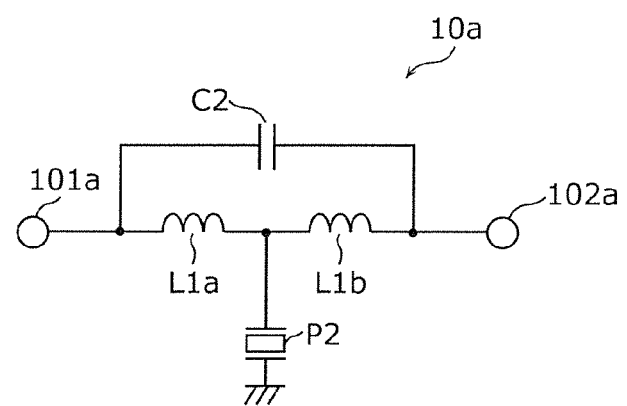
FIG. 9 is a circuit configuration diagram of a filter according to Example 2.

FIG. 9 is a circuit configuration diagram of a filter 10a according to Example 2.

The filter 10a includes inductors L1a and L1b, a capacitor C2, and a parallel-arm resonator P2.

The inductors L1a and L1b are two first impedance elements that are connected in series on a path connecting the terminal 101a and the terminal 102a.

The capacitor C2 is a second impedance element that is connected in parallel with a series circuit including the inductors L1a and L1b. Specifically, the capacitor C2 is connected between a connection point between the inductor L1a and the terminal 101a and a connection point between the inductor L1b and the terminal 102a. Example 2 is different from Example 1 in that the two first impedance elements are inductors and the second impedance element is a capacitor.

In the filter 10a, the inductors L1a and L1b and the capacitor C2 form an LC resonant circuit.

The parallel-arm resonator P2 is an acoustic wave resonator that is connected between the ground and a node between the inductor L1a and the inductor L1b on the path connecting the terminal 101a and the terminal 102a.

Bandpass Characteristics of Filter According to Example 2

Next, bandpass characteristics of the filter 10a according to Example 2 will be explained by comparing it with Comparative Example 2.

Figure 10A:
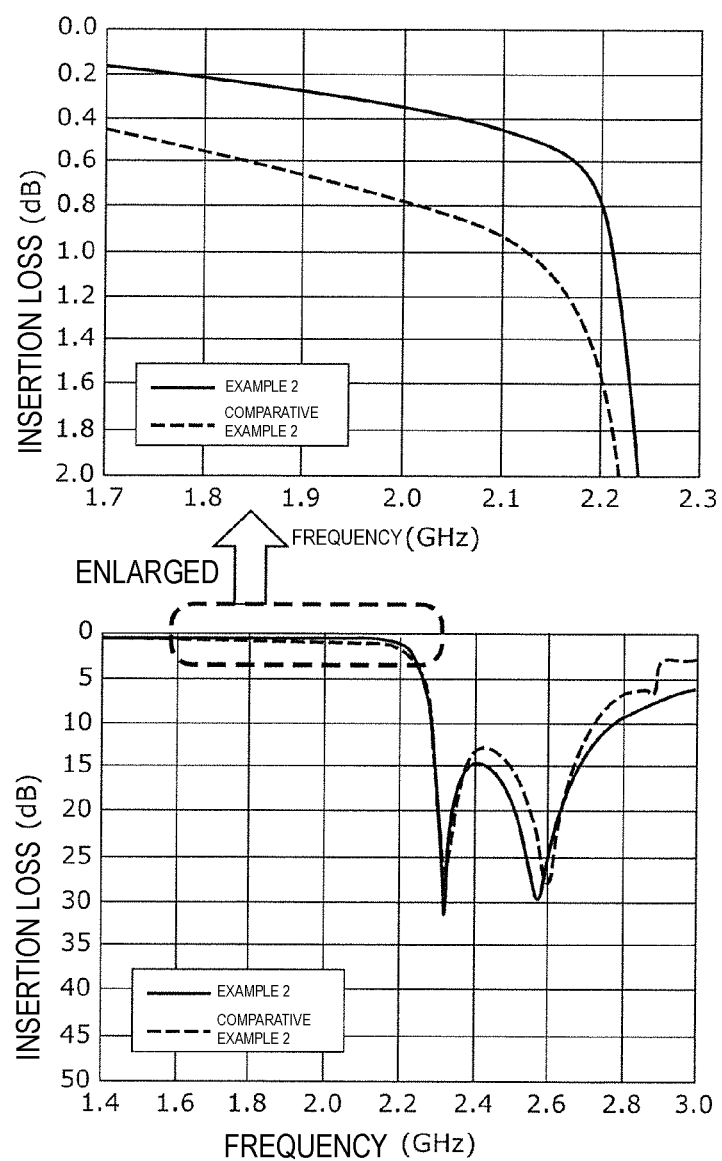
FIG. 10A includes graphs indicating a comparison between bandpass characteristics of a filter (low pass filter) according to Example 2 and bandpass characteristics of a filter (low pass filter) according to Comparative Example 2.

FIG. 10A includes graphs indicating a comparison between bandpass characteristics of the filter 10a (low pass filter) according to Example 2 and bandpass characteristics of the filter 20a (low pass filter) according to Comparative Example 2. In FIG. 10A, solid lines represent the bandpass characteristics of the filter 10a according to Example 2, and broken lines represent the bandpass characteristics of the filter 20a according to Comparative Example 2.

The filter 10a and the filter 20a each include an acoustic wave resonator and each have a sharp attenuation characteristic due to a sharp attenuation pole by the acoustic wave resonator, as illustrated in FIG. 10A. Meanwhile, the filter 10a is able to suppress an increase in insertion loss in the pass band, compared to the filter 20a. Specifically, at 2200 MHz, compared to the insertion loss of the filter 20a, which is 1.561 dB, the insertion of the filter 10a is as small as 0.825 dB.

Figure 10B:
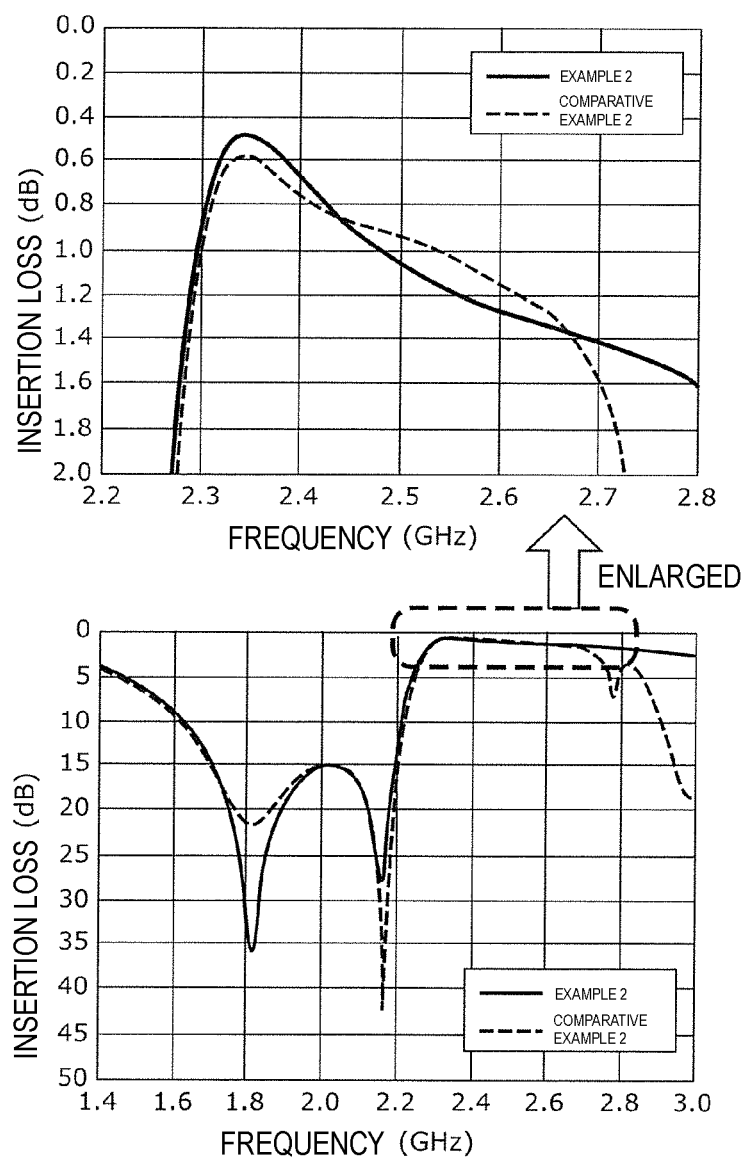
FIG. 10B includes graphs indicating a comparison between bandpass characteristics of a filter (high pass filter) according to Example 2 and bandpass characteristics of a filter (high pass filter) according to Comparative Example 2.

FIG. 10B includes graphs indicating a comparison between bandpass characteristics of the filter 10a (high pass filter) according to Example 2 and bandpass characteristics of the filter 20a (high pass filter) according to Comparative Example 2. In FIG. 10B, solid lines represent the bandpass characteristics of the filter 10a according to Example 2, and broken lines represent the bandpass characteristics of the filter 20a according to Comparative Example 2.

The filter 10a and the filter 20a each include an acoustic wave resonator and each have a sharp attenuation characteristic due to a sharp attenuation pole by the acoustic wave resonator, as illustrated in FIG. 10B. Meanwhile, the filter 10a is able to suppress an increase in insertion loss in the pass band (from 2300 MHz to 2690 MHz), compared to the filter 20a. Specifically, at 2300 MHz, compared to the insertion loss of the filter 20a, which is 0.94 dB, the insertion loss of the filter 10a is as small as 0.838 dB. At 2690 MHz, compared to the insertion loss of the filter 20a, which is 1.483 dB, the insertion loss of the filter 10a is as small as 1.391 dB.

As described above, the filter 10a that has a sharp attenuation characteristic and a low-loss pass band can be implemented.

Example 3

Figure 11:
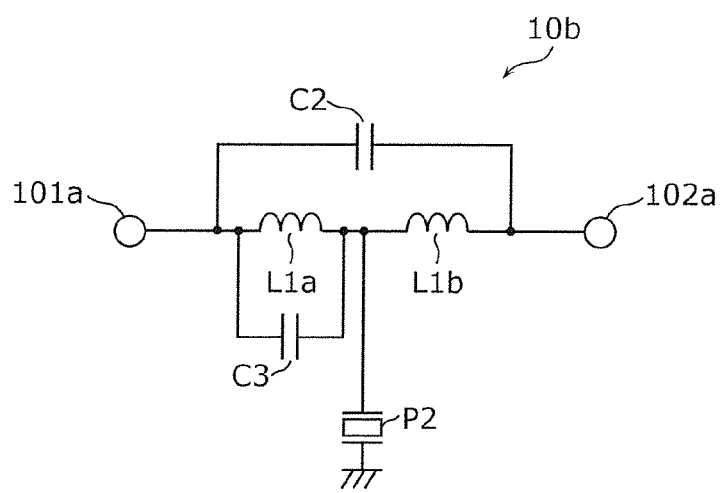
FIG. 11 is a circuit configuration diagram of a filter according to Example 3.

FIG. 11 is a circuit configuration diagram of a filter 10b according to Example 3.

For example, the filters according to Examples 1 and 2 may further include a third impedance element that is connected in parallel with one of the two first impedance elements. In the case where the first impedance elements are inductors, the third impedance element is a capacitor. In the case where the first impedance elements are capacitors, the third impedance element is an inductor. Hereinafter, a filter in which inductors are provided as first impedance elements and a capacitor is provided as a third impedance element, specifically, the filter 10b in which a capacitor C3 is connected in parallel with the inductor L1a (first impedance element) according to Example 2, will be described as Example 3.

The filter 10b includes the capacitor C3, in addition to the configuration of the filter 10a according to Example 2. The other features are the same as those in Example 2, and explanation for those features will be omitted.

The capacitor C3 is connected in parallel with the inductor L1a. The capacitor C3 may be connected in parallel with the inductor L1b, in place of the inductor L1a.

Bandpass Characteristics of Filter According to Example 3

Next, bandpass characteristics of the filter 10b according to Example 3 will be explained by comparing it with Comparative Example 2.

Figure 12:
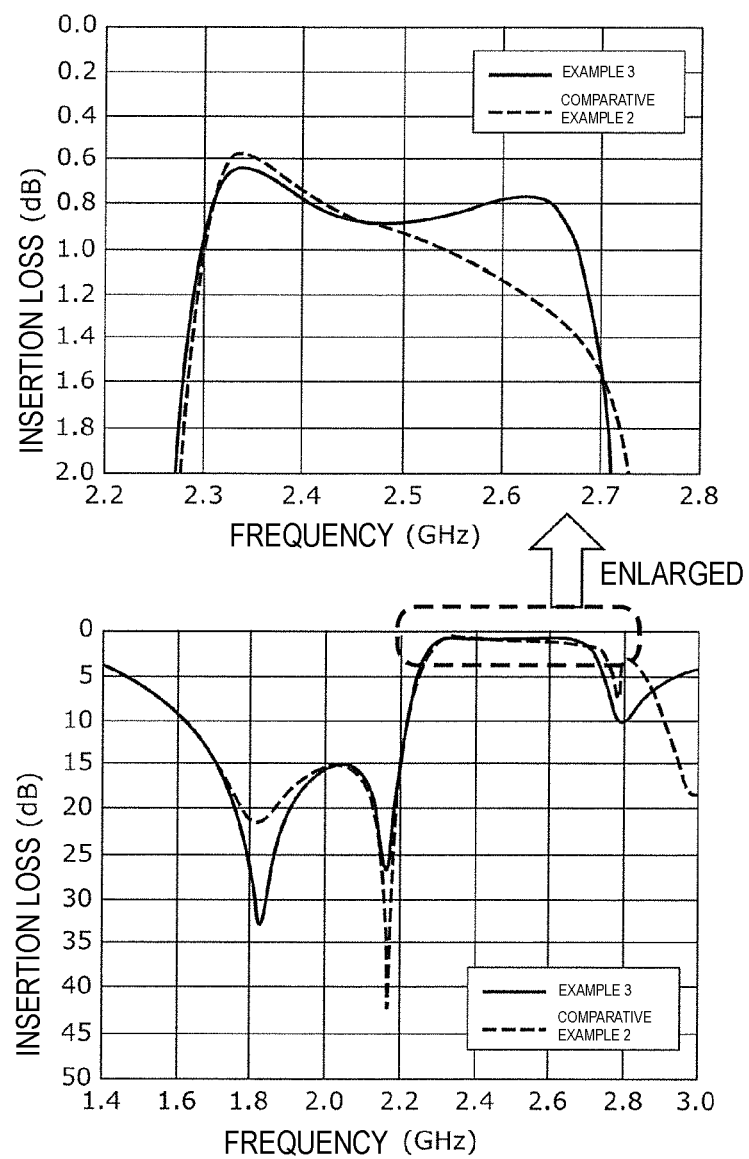
FIG. 12 includes graphs indicating a comparison between bandpass characteristics of the filter according to Example 3 and bandpass characteristics of the filter according to Comparative Example 2.

FIG. 12 includes graphs indicating a comparison between bandpass characteristics of the filter 10b according to Example 3 and bandpass characteristics of the filter 20a according to Comparative Example 2. In FIG. 12, solid lines represent the bandpass characteristics of the filter 10b according to Example 3, and broken lines represent the bandpass characteristics of the filter 20a according to Comparative Example 2. The graphs in FIG. 12 indicate bandpass characteristics in the case where the filters 10b and 20a are designed to function as high pass filters.

The filters 10b and 20a each include an acoustic wave resonator and each have a sharp attenuation characteristic due to a sharp attenuation pole by the acoustic wave resonator, as illustrated in FIG. 12. Meanwhile, the filter 10b is able to suppress an increase in insertion loss in the pass band (from 2300 MHz to 2690 MHz), compared to the filter 20a. Specifically, at 2300 MHz, compared to the insertion loss of the filter 20a, which is 0.94 dB, the insertion loss of the filter 10a is as small as 0.907 dB, and at 2690 MHz, compared to the insertion loss of the filter 20a, which is 1.483 dB, the insertion loss of the filter 10a is as small as 1.314 dB. In Example 3, with provision of the capacitor C3, impedance near the higher frequency end of the pass band can be made closer to 50Ω. Thus, at 2690 MHz, insertion loss can be reduced compared to Example 2.

As described above, the filter 10b that has a sharp attenuation characteristic and a low-loss pass band can be implemented.

Although detailed explanation will be omitted, by connecting an inductor in parallel with the capacitor C1a (first impedance element) according to Example 1, the filter 10 that has a sharp attenuation characteristic and a low-loss pass band can be implemented, as in Example 3.

[Application to Multiplexer]

The filters according to Examples 1 to 3 described above can be applied to multiplexers. Such multiplexers will be described in Examples 4 to 11. Specifically, the multiplexers according to Examples 4 to 11 each include a plurality of filters according to one or more of Examples 1 to 3. As described below in Examples 6, 9, and 10, a multiplexer may include a filter other than the plurality of filters (a third filter in Example 6, a low pass filter in Example 9, and a high pass filter in Example 10). Input terminals or output terminals of the plurality of filters are connected to a common terminal. The plurality of filters include at least a first filter and a second filter. An input terminal or an output terminal of the first filter and an input terminal or an output terminal of the second filter are connected to a common terminal. Hereinafter, in Examples and Comparative Examples, input terminals of the plurality of filters are connected to a common terminal. However, output terminals of the plurality of filters may be connected to a common terminal. In the case where a multiplexer includes a filter other than the plurality of filters, an input terminal or an output terminal of the filter other than the plurality of filters is also connected to the common terminal.

Furthermore, for example, each of the multiplexers according to Examples 4 to 11 may support so-called CA in which signals of a plurality of frequency bands corresponding to filters forming the multiplexer (filters whose input terminals or output terminals are connected to a common terminal in the multiplexer) are transmitted and received at the same time.

Furthermore, a plurality of frequency bands corresponding to the filters forming the multiplexer may be, for example, LTE (Long Term Evolution: 4G) Bands or NR (New Radio: 5G) Bands. Moreover, the plurality of frequency bands may be, for example, sub 6 GHz (n77 (3.3 GHz to 4.2 GHz), n78 (3.3 GHz to 3.8 GHz), n79 (4.4 GHz to 5.0 GHz), and 5.0 GHz to 7.125 GHz), as NR Bands. As a band from 5.0 GHz to 7.125 GHz, for example, Band 46 (5150 MHz to 5925 MHz), Band (5855 MHz to 5925 MHz), or the like is used. Furthermore, the plurality of frequency bands may be, for example, GPS (Global Positioning System) L5. Moreover, the plurality of frequency bands may include Wi-Fi® 5 GHz. For example, the 5 GHz band may range from 5150 MHz to 5725 MHz. For example, the pass band of each of the first filter and the second filter may include any one of the frequency bands mentioned above.

Furthermore, for example, a multiplexer may include at least two of a filter whose pass band includes 699 MHz to 960 MHz, a filter whose pass band includes 1.2 GHz, a filter whose pass band includes 1.4 GHz to 5 GHz, and a filter whose pass band includes 5 GHz to 7.125 GHz. Furthermore, for example, a multiplexer may include at least two of a filter whose pass band includes 699 MHz to 2.7 GHz, a filter whose pass band includes 3.3 GHz to 4.2 GHz, a filter whose pass band includes 4.4 GHz to 5 GHz, and a filter whose pass band includes 5 GHz to 7.125 GHz.

Example 4

Figure 13:
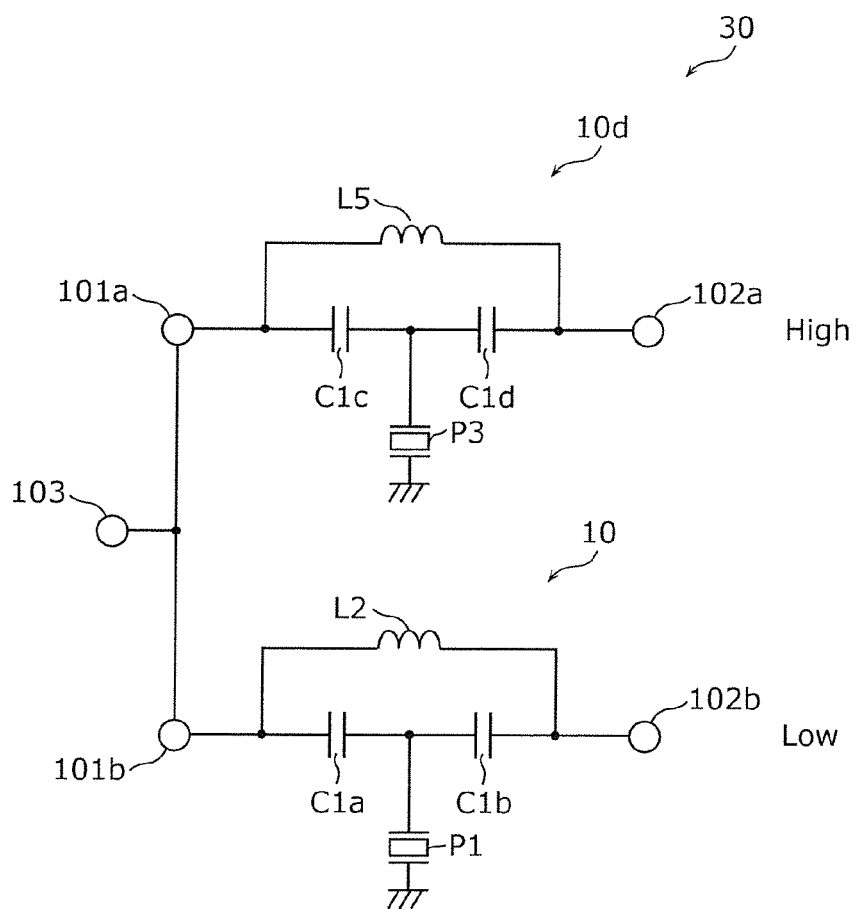
FIG. 13 is a circuit configuration diagram of a multiplexer according to Example 4.

FIG. 13 is a circuit configuration diagram of a multiplexer 30 according to Example 4.

A plurality of filters provided in the multiplexer 30 include a first filter and a second filter as two filters according to one or more of Examples 1 to 3. Specifically, the multiplexer 30 is a diplexer that includes two filters according to Example 1. In Example 4, the two filters according to Example 1 are referred to as filters 10 and 10d. For example, the filter 10d is the first filter, and the filter 10 is the second filter.

The filter 10d includes capacitors C1c and C1d, an inductor L5, and a parallel-arm resonator P3.

The capacitors C1c and C1d are two first impedance elements that are connected in series on the path connecting the terminal 101a and the terminal 102a.

The inductor L5 is a second impedance element that is connected in parallel with a series circuit including the capacitors C1c and C1d. Specifically, the inductor L5 is connected between a connection point between the capacitor C1c and the terminal 101a and a connection point between the capacitor C1d and the terminal 102a.

The parallel-arm resonator P3 is an acoustic wave resonator that is connected between the ground and a node between the capacitors C1c and C1d on the path connecting the terminal 101a and the terminal 102a.

As described above, the filter 10d has a configuration similar to that of the filter 10 according to Example 1.

The first impedance elements provided in the filter 10d and the first impedance elements included in the filter 10 are capacitors.

A terminal 101b is, for example, an input terminal, and a terminal 102b is, for example, an output terminal. In the multiplexer 30, the input terminal (terminal 101a) of the filter 10d and the input terminal (terminal 101b) of the filter 10 are connected in common to a common terminal 103. The common terminal 103 and each of the terminals 101a and 101b may be connected directly without any other elements interposed therebetween or connected indirectly with other elements interposed therebetween.

For example, the filter 10d is a high pass filter, and the filter 10 is a low pass filter. Furthermore, for example, the pass band of the filter 10d is higher than the pass band of the filter 10. Accordingly, the multiplexer 30 is able to handle two frequency bands. In FIG. 13, the description "High" provided next to the terminal 102a of the filter 10d and the description "Low" provided next to the terminal 102b of the filter 10 indicate that the pass band of the filter 10d is higher than the pass band of the filter 10.

Bandpass Characteristics of Multiplexer According to Example 4

Next, bandpass characteristics of the multiplexer 30 according to Example 4 will be explained by comparing it with Comparative Example 3.

Figure 14:
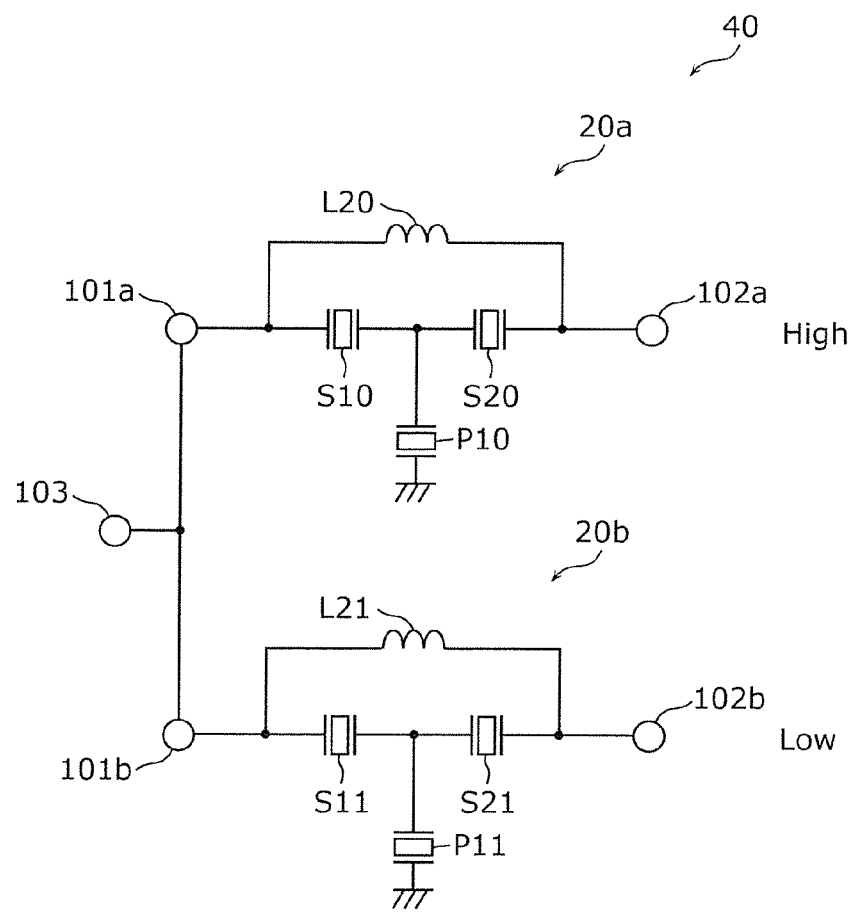
FIG. 14 is a circuit configuration diagram of a multiplexer according to Comparative Example 3.

FIG. 14 is a circuit configuration diagram of a multiplexer 40 according to Comparative Example 3.

The multiplexer 40 is a diplexer including two filters according to Comparative Example 2. In Comparative Example 3, the two filters according to Comparative Example 2 are referred to as filters 20*a* and 20*b*. The configuration of the filter 20*b* is the same as that of the filter 20*a*, and explanation for the configuration of the filter 20*b* will be omitted.

For example, the filter 20*a* is a high pass filter, and the filter 20*b* is a low pass filter. Furthermore, for example, the pass band of the filter 20*a* is higher than the pass band of the filter 20*b*. In FIG. 14, the description "High" provided next to the terminal 102*a* of the filter 20*a* and the description "Low" provided next to the terminal 102*b* of the filter 20*b* indicate that the pass band of the filter 20*a* is higher than the pass band of the filter 20*b*. Element values configuring the filter 20*a* are set such that the pass band of the filter 20*a* is equivalent to the pass band of the filter 10*d*, and element values configuring the filter 20*b* are set such that the pass band of the filter 20*b* is equivalent to the pass band of the filter 10.

Figure 15:
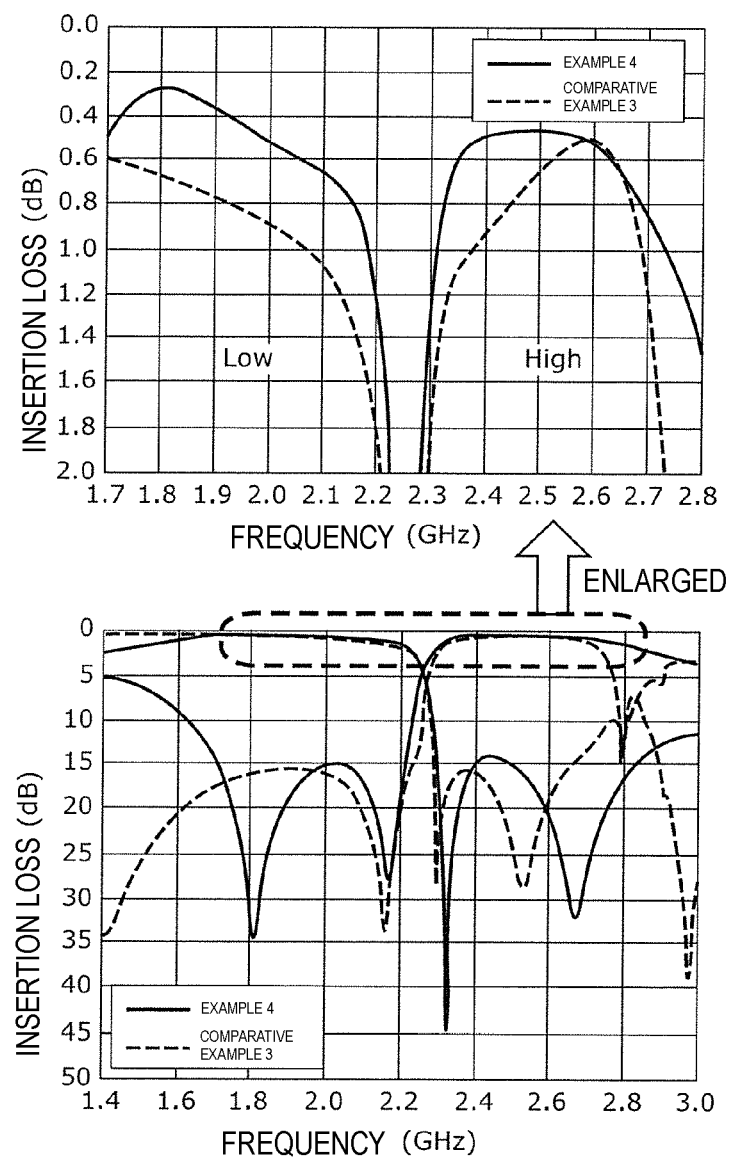
FIG. 15 includes graphs indicating a comparison between bandpass characteristics of the multiplexer according to Example 4 and bandpass characteristics of the multiplexer according to Comparative Example 3.

FIG. 15 includes graphs indicating a comparison between bandpass characteristics of the multiplexer 30 according to Example 4 and bandpass characteristics of the multiplexer 40 according to Comparative Example 3. In FIG. 15, solid lines represent the bandpass characteristics of the multiplexer 30 according to Example 4, and broken lines represent the bandpass characteristics of the multiplexer 40 according to Comparative Example 3. In FIG. 15, the description "High" is provided for the pass band of the filter 10*d* forming the multiplexer 30 and the pass band of the filter 20*a* forming the multiplexer 40. Furthermore, the description "Low" is provided for the pass band of the filter 10 forming the multiplexer 30 and the pass band of the filter 20*b* forming the multiplexer 40.

The filters 10*d* and 20*a* each include an acoustic wave resonator, and each of the multiplexers has a sharp attenuation characteristic in a lower frequency end of the pass band indicated by "High" in FIG. 15 due to a sharp attenuation pole by the acoustic wave resonator. Furthermore, the filters 10 and 20*b* each have an acoustic wave resonator, and each of the multiplexers has a sharp attenuation characteristic in the higher frequency end of the pass band indicated by "Low" in FIG. 15 due to a sharp attenuation pole by the acoustic wave resonator. Meanwhile, the multiplexer 30 is able to suppress an increase in insertion loss in the pass band, compared to the multiplexer 40. Specifically, at 2200 MHz, compared to the insertion loss of the multiplexer 40, which is 1.806 dB, the insertion loss of the multiplexer 30 is as small as 1.226 dB. Furthermore, at 2300 MHz, compared to the insertion loss of the multiplexer 40, which is 1.778 dB, the insertion loss of the multiplexer 30 is as small as 1.217 dB, and at 2690 MHz, compared to the insertion loss of the multiplexer 40, which is 1.02 dB, the insertion loss of the multiplexer 30 is as small as 0.788 dB.

As described above, the multiplexer 30 that has sharp attenuation characteristics and low-loss pass bands can be implemented.

Although the filter 10*d* (the filter according to Example 1) is used as the first filter in this example, the filter 10*a* (the filter according to Example 2) may be used as the first filter.

However, as in Example 4, by using capacitors as the first impedance elements provided in the filter 10*d* (first filter) and the first impedance elements provided in the filter 10 (second filter), a multiplexer with low-loss pass bands compared to the case where the filter 10*a* is used as the first filter can be implemented.

This is because Q values of inductors are lower than capacitors and using the filter 10*d* according to Example 1, which includes less inductors than the filter 10*a* according to Example 2, reduces the total number of inductors with low Q values that are used in a multiplexer. That is, this is because the total number of capacitors with high Q values that are used in a multiplexer increases, and a reduction in the loss can thus be achieved.

Example 5

Figure 16:
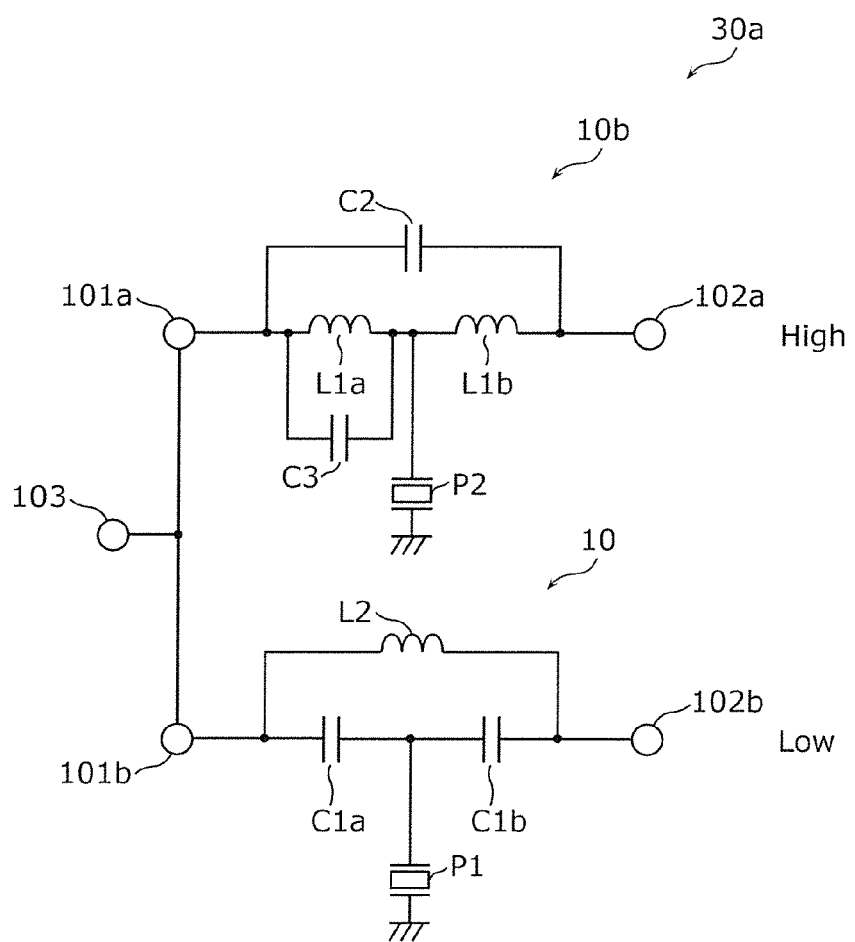
FIG. 16 is a circuit configuration diagram of a multiplexer according to Example 5.

FIG. 16 is a circuit configuration diagram of a multiplexer 30*a* according to Example 5.

The multiplexer 30*a* includes a filter 10*b* in place of the filter 10*d* of the multiplexer 30 according to Example 4. The other features are the same as those in Example 4, and explanation for those features will be omitted.

For example, the filter 10*b* is a high pass filter, and the filter 10 is a low pass filter. Furthermore, for example, the pass band of the filter 10*b* is higher than the pass band of the filter 10. Accordingly, the multiplexer 30*a* is able to handle two frequency bands. In FIG. 16, the description "High" provided next to the terminal 102*a* of the filter 10*b* and the description "Low" provided next to the terminal 102*b* of the filter 10 indicate that the pass band of the filter 10*b* is higher than the pass band of the filter 10.

Bandpass Characteristics of Multiplexer According to Example 5

Figure 17:
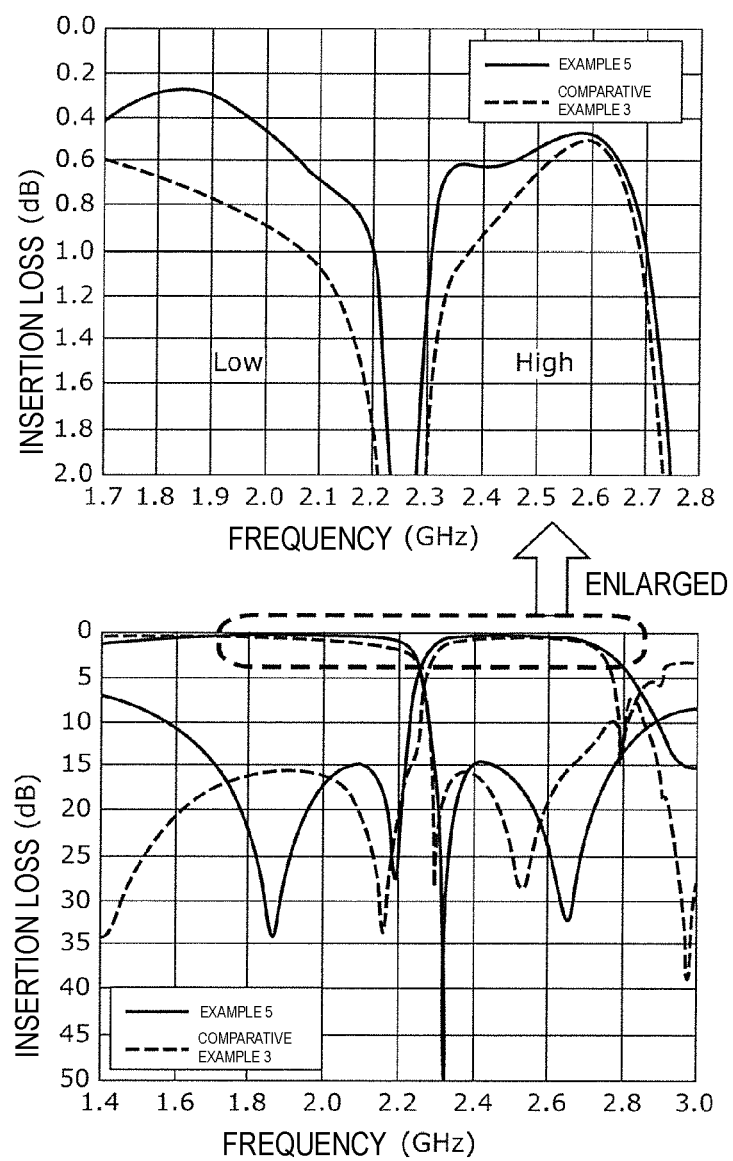
FIG. 17 includes graphs indicating a comparison between bandpass characteristics of the multiplexer according to Example 5 and bandpass characteristics of the multiplexer according to Comparative Example 3.

FIG. 17 includes graphs indicating a comparison between bandpass characteristics of the multiplexer 30*a* according to Example 5 and bandpass characteristics of the multiplexer 40 according to Comparative Example 3. In FIG. 17, solid lines represent the bandpass characteristics of the multiplexer 30*a* according to Example 5, and broken lines represent the bandpass characteristics of the multiplexer 40 according to Comparative Example 3. In FIG. 17, the description "High" is provided for the pass band of the filter 10*b* forming the multiplexer 30*a* and the pass band of the filter 20*a* forming the multiplexer 40. Furthermore, the description "Low" is provided for the pass band of the filter 10 forming the multiplexer 30*a* and the pass band of the filter 20*b* forming the multiplexer 40.

The filters 10*b* and 20*a* each include an acoustic wave resonator, and each of the multiplexers has a sharp attenuation characteristic in the lower frequency end of the pass band indicated by "High" in FIG. 17 due to a sharp attenuation pole by the acoustic wave resonator. Furthermore, the filters 10 and 20*b* each include an acoustic wave resonator, and each of the multiplexers has a sharp attenuation characteristic in the higher frequency end of the pass band indicated by "Low" in FIG. 17 due to a sharp attenuation pole by the acoustic wave resonator. Meanwhile, the multiplexer 30*a* is able to suppress an increase in insertion loss in the pass band, compared to the multiplexer 40. Specifically, at 2200 MHz, compared to the insertion loss of the multiplexer 40, which is 1.806 dB, the insertion loss of the multiplexer 30*a* is as small as 1.05 dB. Furthermore, at 2300 MHz, compared to the insertion loss of the multiplexer 40, which is 1.778 dB, the insertion loss of the multiplexer 30 is as small as 1.074 dB, and at 2690 MHz, compared to the insertion loss of the multiplexer 40, which is 1.02 dB, the insertion loss of the multiplexer 30 is as small as 0.897 dB.

As described above, the multiplexer 30*a* that has sharp attenuation characteristics and low-loss pass bands can be implemented.

Example 6

Figure 18:
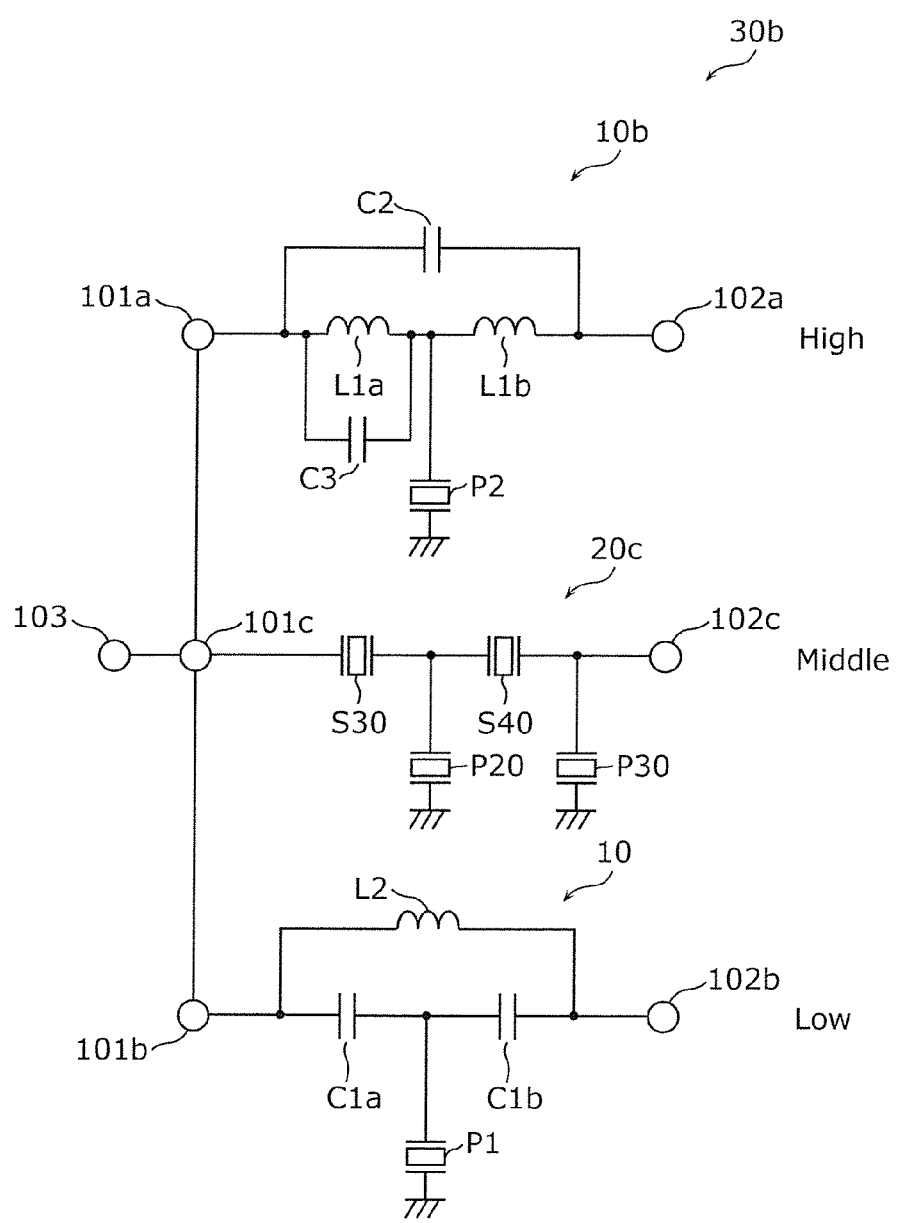
FIG. 18 is a circuit configuration diagram of a multiplexer according to Example 6.

FIG. 18 is a circuit configuration diagram of a multiplexer 30*b* according to Example 6.

A plurality of filters provided in the multiplexer 30b include a first filter and a second filter as two filters according to one or more of Examples 1 to 3. The multiplexer 30b further includes a third filter whose input terminal or output terminal is connected to a common terminal. The third filter includes at least one series-arm resonator and at least one parallel-arm resonator. Specifically, the multiplexer 30b is a triplexer including the filter 10 according to Example 1, the filter 10b according to Example 3, and a filter 20c. For example, the filter 10b is a first filter, the filter 10 is a second filter, and the filter 20c is a third filter.

A terminal 101c is, for example, an input terminal, and a terminal 102c is, for example, an output terminal. In the multiplexer 30b, an input terminal (terminal 101a) of the filter 10b, an input terminal (terminal 101c) of the filter 20c, and an input terminal (terminal 101b) of the filter 10 are connected in common to the common terminal 103. The common terminal 103 and each of the terminals 101a, 101b, and 101c may be connected directly without any other elements interposed therebetween or connected indirectly with other elements interposed therebetween.

For example, the filter 10b is a high pass filter, the filter 10 is a low pass filter, and the filter 20c is a band pass filter. Furthermore, for example, the pass band of the filter 10b is higher than the pass band of the filter 10, and the pass band of the filter 20c is lower than the pass band of the filter 10b and higher than the pass band of the filter 10. Accordingly, the multiplexer 30b is able to handle three frequency bands. In FIG. 18, the description "High" provided next to the terminal 102a of the filter 10b, the description "Middle" provided next to the terminal 102c of the filter 20c, and the description "Low" provided next to the terminal 102b of the filter 10 indicate that the pass band of the filter 10b is higher than the pass band of the filter 20c and the pass band of the filter 20c is higher than the pass band of the filter 10.

The filter 20c includes series-arm resonators S30 and S40 as at least one series-arm resonator and parallel-arm resonators P20 and P30 as at least one parallel-arm resonator. The series-arm resonators S30 and S40 are connected in series on a path connecting the terminal 101c and the terminal 102c. The parallel-arm resonator P20 is connected between the ground and a node between the series-arm resonator S30 and the series-arm resonator S40, and the parallel-arm resonator P30 is connected between the ground and a node between the series-arm resonator S40 and the terminal 102c. The filter 20c may include one series-arm resonator or three or more series-arm resonators as at least one series-arm resonator and may include one parallel-arm resonator or three or more parallel-arm resonators as at least one parallel-arm resonator.

Bandpass Characteristics of Multiplexer According to Example 6

Next, bandpass characteristics of the multiplexer 30b according to Example 6 will be explained by comparing it with Comparative Example 4.

Figure 19:
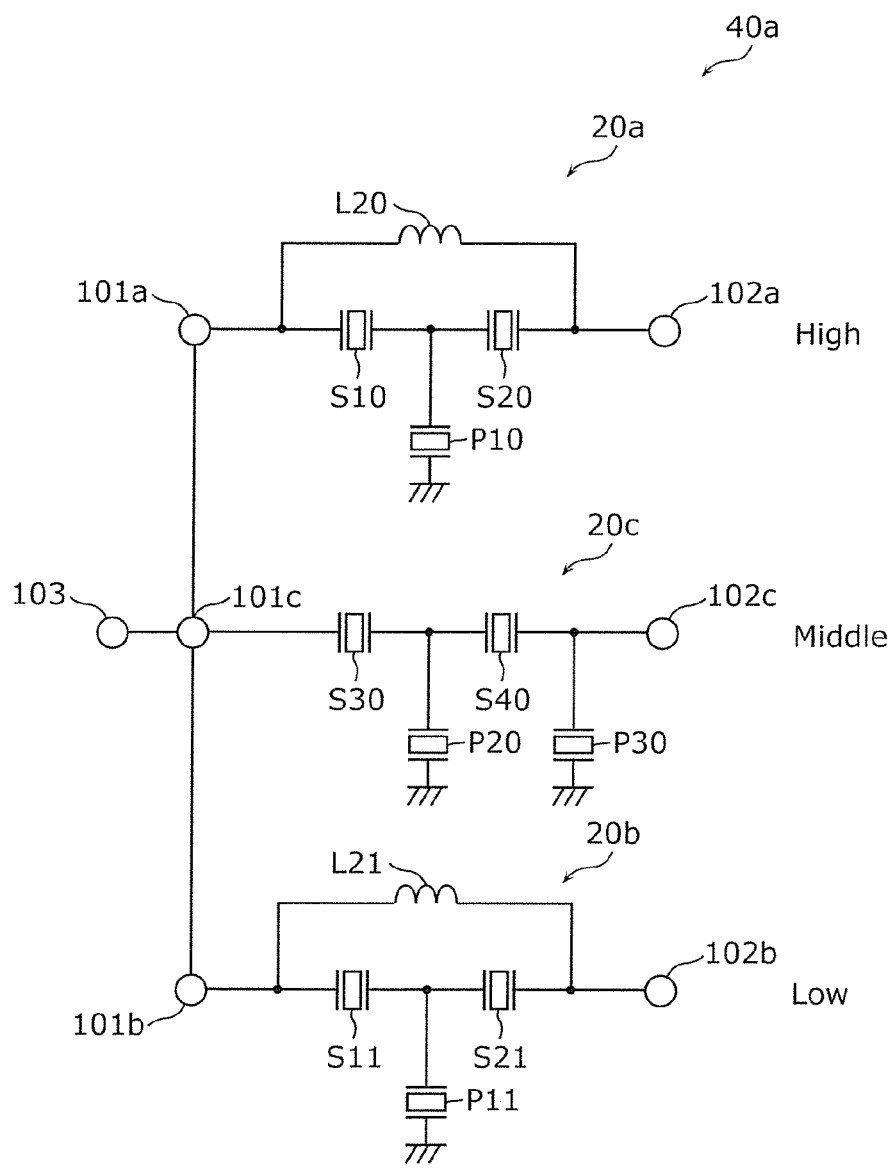
FIG. 19 is a circuit configuration diagram of a multiplexer according to Comparative Example 4.

FIG. 19 is a circuit configuration diagram of a multiplexer 40a according to Comparative Example 4.

The multiplexer 40a is a triplexer including two filters according to Comparative Example 2 and the filter 20c. In this example, the two filters according to Comparative Example 2 are referred to as the filters 20a and 20b. Furthermore, the filter 20c according to Comparative Example 4 is the same as that in Example 6.

For example, the filter 20a is a high pass filter, the filter 20b is a low pass filter, and the filter 20c is a band pass filter.

Furthermore, for example, the pass band of the filter 20a is higher than the pass band of the filter 20b, and the pass band of the filter 20c is lower than the pass band of the filter 20a and higher than the pass band of the filter 20b. In FIG. 19, the description "High" provided next to the terminal 102a of the filter 20a, the description "Middle" provided next to the terminal 102c of the filter 20c, and the description "Low" provided next to the terminal 102b of the filter 20b indicate that the pass band of the filter 20a is higher than the pass band of the filter 20c and the pass band of the filter 20c is higher than the pass band of the filter 20b. Element values configuring the filter 20a are set such that the pass band of the filter 20a is equivalent to the pass band of the filter 10b, and element values configuring the filter 20b are set such that the pass band of the filter 20b is equivalent to the pass band of the filter 10.

Figure 20:
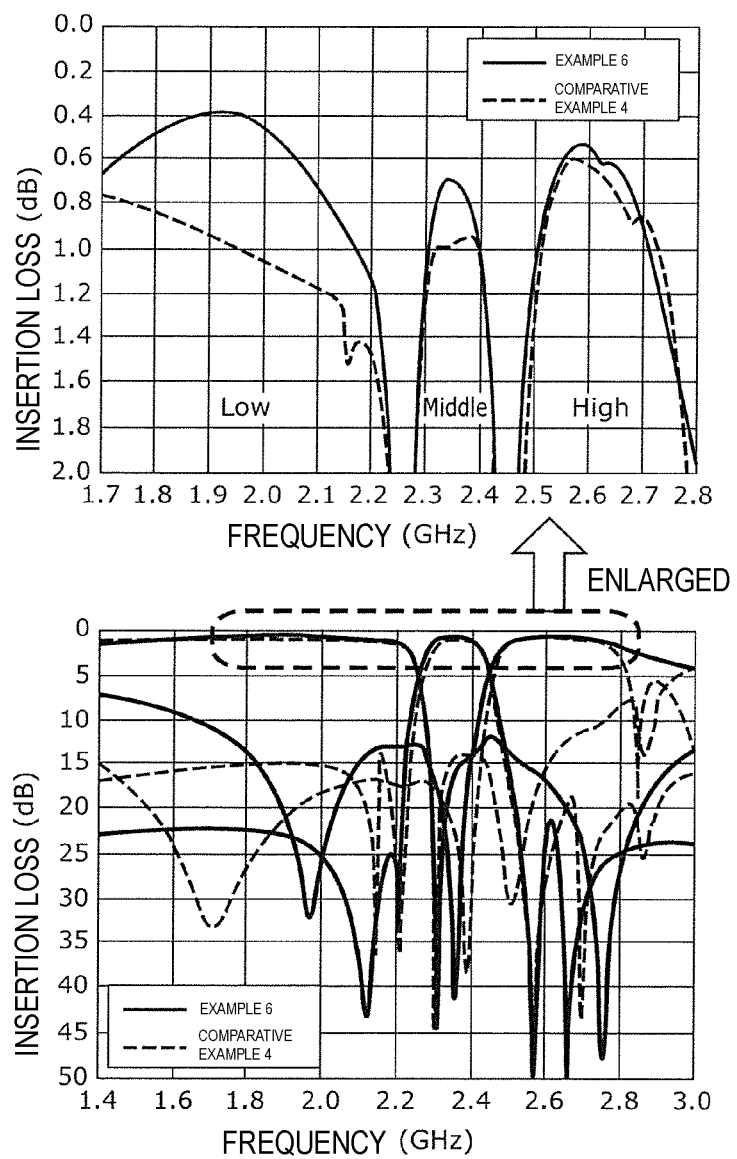
FIG. 20 includes graphs indicating a comparison between bandpass characteristics of the multiplexer according to Example 6 and bandpass characteristics of the multiplexer according to Comparative Example 4.

FIG. 20 includes graphs indicating a comparison between bandpass characteristics of the multiplexer 30b according to Example 6 and bandpass characteristics of the multiplexer 40a according to Comparative Example 4. In FIG. 20, solid lines represent the bandpass characteristics of the multiplexer 30b according to Example 6, and broken lines represent the bandpass characteristics of the multiplexer 40a according to Comparative Example 4. In FIG. 20, the description "High" is provided for the pass band of the filter 10b forming the multiplexer 30b and the pass band of the filter 20a forming the multiplexer 40a. Furthermore, the description "Middle" is provided for the pass bands of the filters 20c forming the multiplexers 30b and 40a. Furthermore, the description "Low" is provided for the pass band of the filter 10 forming the multiplexer 30b and the pass band of the filter 20b forming the multiplexer 40a.

The filters 10b and 20a each include an acoustic wave resonator, and each of the multiplexers has a sharp attenuation characteristic in the lower frequency end of the pass band indicated by "High" in FIG. 20 due to a sharp attenuation pole by the acoustic wave resonator. Furthermore, the filters 10 and 20b each include an acoustic wave resonator, and each of the multiplexers has a sharp attenuation characteristic in the higher frequency end of the pass band indicated by "Low" in FIG. 20 due to a sharp attenuation pole by the acoustic wave resonator. Meanwhile, the multiplexer 30b is able to suppress an increase in insertion loss in the pass band, compared to the multiplexer 40a. Specifically, at 2200 MHz, compared to the insertion loss of the multiplexer 40a, which is 1.488 dB, the insertion loss of the multiplexer 30b is as small as 1.15 dB. Furthermore, at 2500 MHz, compared to the insertion loss of the multiplexer 40a, which is 1.225 dB, the insertion loss of the multiplexer 30b is as small as 1.074 dB.

As described above, the multiplexer 30b that has sharp attenuation characteristics and low-loss pass bands can be implemented.

Example 7

Figure 21:
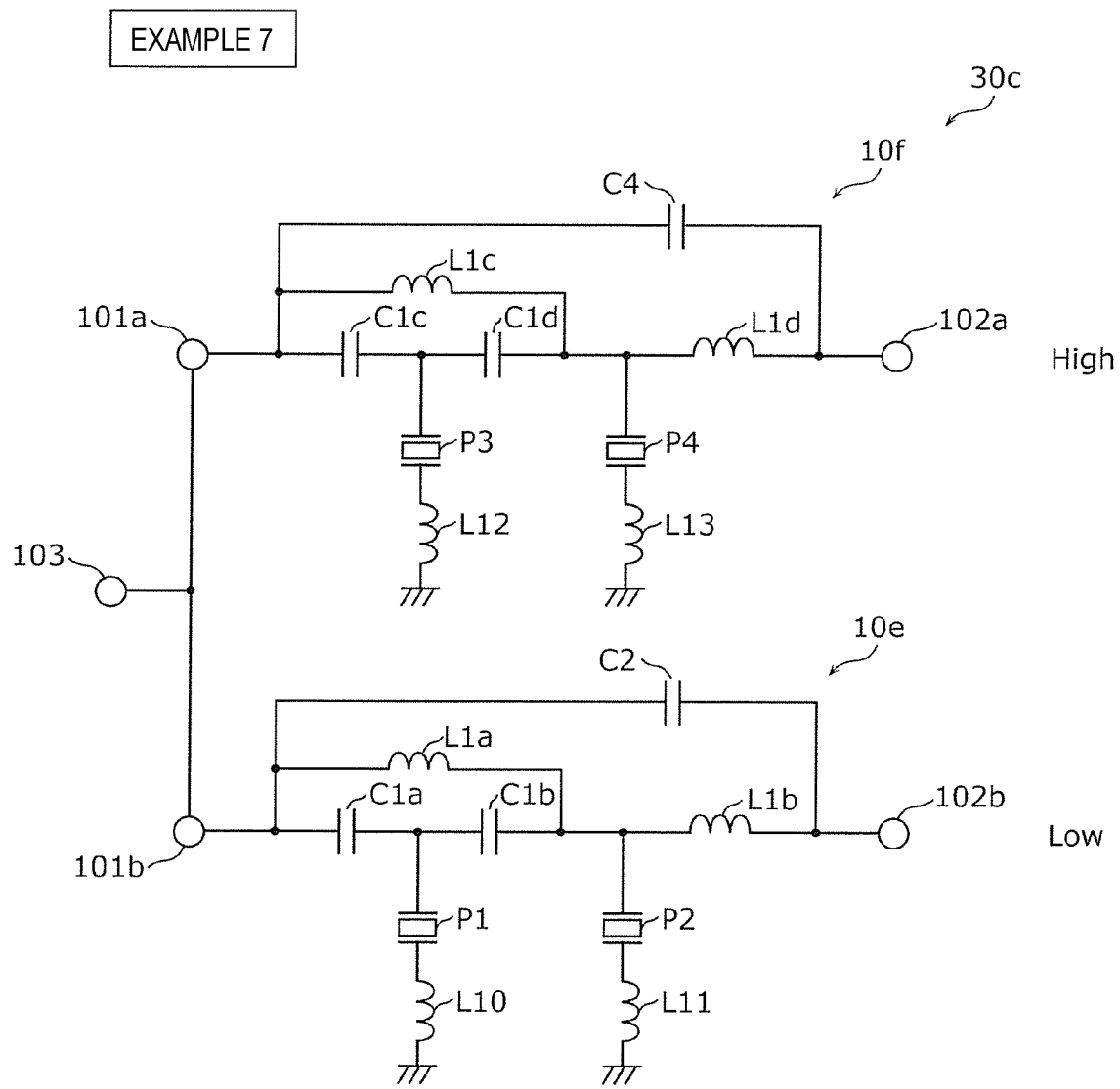
FIG. 21 is a circuit configuration diagram of a multiplexer according to Example 7.

FIG. 21 is a circuit configuration diagram of a multiplexer 30c according to Example 7.

A plurality of filters provided in the multiplexer 30c include a first filter and a second filter as a combination of filters according to one or more of Examples 1 to 3. Specifically, the multiplexer 30c is a diplexer including filters 10e and 10f, and each of the filters 10e and 10f is a combination of filters according to Examples 1 and 2. For example, the filter 10f is a first filter, and the filter 10e is a second filter.

The filter 10e includes capacitors C1a, C1b, and C2, inductors L1a, L1b, L10, and L11, and parallel-arm resonators P1 and P2.

The capacitors C1a and C1b are two first impedance elements that are connected in series on a path connecting the terminal 101b and the terminal 102b.

The inductor L1a is a second impedance element that is connected in parallel with a series circuit including the capacitors C1a and C1b. Specifically, the inductor L1a is connected between a connection point between the capacitor C1a and the terminal 101b and a connection point between the capacitor C1b and the inductor L1b.

The parallel-arm resonator P1 is an acoustic wave resonator that is connected between the ground and a node between the capacitor C1a and the capacitor C1b on the path connecting the terminal 101b and the terminal 102b.

The inductor L10 is an inductor that is connected between the node and the ground in series with the parallel-arm resonator P1.

A filter including the capacitors C1a and C1b, the inductor L1a, and the parallel-arm resonator P1 in the filter 10e has a configuration similar to that of the filter 10 according to Example 1.

In Example 7, the inductor L1a also serves as a first impedance element. This is because the inductors L1a and L1b are connected in series on the path connecting the terminal 101b and the terminal 102b and the inductors L1a and L1b serve as first impedance elements in the case where attention is paid to the inductors L1a and L1b and the capacitor C2.

The capacitor C2 is a second impedance element that is connected in parallel with a series circuit including the inductors L1a and L1b. Specifically, the capacitor C2 is connected between a connection point between the inductor L1a and the terminal 101b and a connection point between the inductor L1b and the terminal 102b.

The parallel-arm resonator P2 is an acoustic wave resonator that is connected between the ground and a node between the inductor L1a and the inductor L1b on the path connecting the terminal 101b and the terminal 102b.

The inductor L11 is an inductor that is connected between the node and the ground in series with the parallel-arm resonator P2.

A filter including the inductors L1a and L1b, the capacitor C2, and the parallel-arm resonator P2 in the filter 10e has a configuration similar to that of the filter 10a according to Example 2.

The filter 10f includes capacitors C1c, C1d, and C4, inductors L1c, L1d, L12, and L13, and parallel-arm resonators P3 and P4.

The capacitors C1c and C1d are two first impedance elements that are connected in series on a path connecting the terminal 101a and the terminal 102a.

The inductor L1c is a second impedance element that is connected in parallel with a series circuit including the capacitors C1c and C1d. Specifically, the inductor L1c is connected between a connection point between the capacitor C1c and the terminal 101a and a connection point between the capacitor C1d and the inductor L1d.

The parallel-arm resonator P3 is an acoustic wave resonator that is connected between the ground and a node between the capacitor C1c and the capacitor C1d on the path connecting the terminal 101a and the terminal 102a.

The inductor L12 is an inductor that is connected between the node and the ground in series with the parallel-arm resonator P3.

A filter including the capacitors C1c and C1d, the inductor L1c, and the parallel-arm resonator P3 in the filter 10f has a configuration similar to that of the filter 10 according to Example 1.

In Example 7, the inductor L1c also serves as a first impedance element. This is because the inductors L1c and L1d are connected in series on the path connecting the terminal 101a and the terminal 102a and the inductors L1c and L1d serve as first impedance elements in the case where attention is paid to the inductors L1c and L1d and the capacitor C4.

The capacitor C4 is a second impedance element that is connected in parallel with a series circuit including the inductors L1c and L1d. Specifically, the capacitor C4 is connected between a connection point between the inductor L1c and the terminal 101a and a connection point between the inductor L1d and the terminal 102a.

The parallel-arm resonator P4 is an acoustic wave resonator that is connected between the ground and a node between the inductor L1c and the inductor L1d on the path connecting the terminal 101a and the terminal 102a.

The inductor L13 is an inductor that is connected between the node and the ground in series with the parallel-arm resonator P4.

A filter including the inductors L1c and L1d, the capacitor C4, and the parallel-arm resonator P4 in the filter 10f has a configuration similar to that of the filter 10a according to Example 2.

In the multiplexer 30c, an input terminal (terminal 101a) of the filter 10f and an input terminal (terminal 101b) of the filter 10e are connected in common to the common terminal 103. The common terminal 103 and each of the terminals 101a and 101b may be connected directly without any other elements interposed therebetween or connected indirectly with other elements interposed therebetween.

For example, the filter 10f is a high pass filter, and the filter 10e is a low pass filter. Furthermore, for example, the pass band of the filter 10f is higher than the pass band of the filter 10e. Accordingly, the multiplexer 30c is able to handle two frequency bands. In FIG. 21, the description "High" provided next to the terminal 102a of the filter 10f and the description "Low" provided next to the terminal 102b of the filter 10e indicate that the pass band of the filter 10f is higher than the pass band of the filter 10e.

Bandpass Characteristics of Multiplexer According to Example 7

Next, bandpass characteristics of the multiplexer 30c according to Example 7 will be explained.

Figure 22:
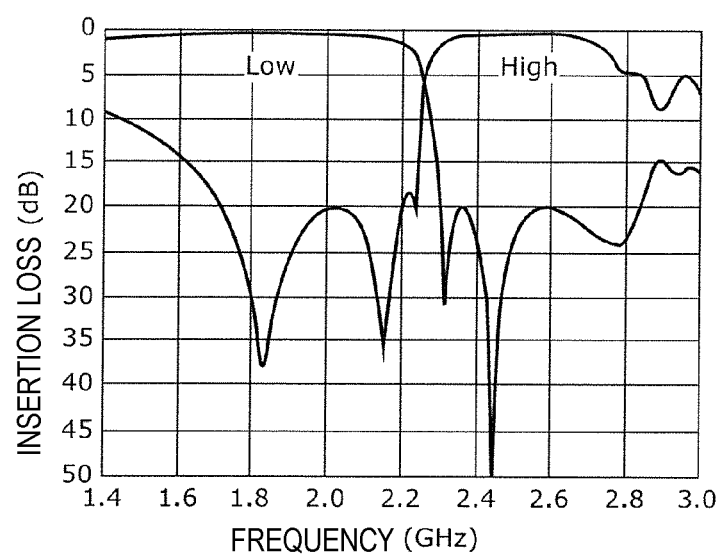
FIG. 22 is a graph indicating bandpass characteristics of the multiplexer according to Example 7.

FIG. 22 is a graph indicating the bandpass characteristics of the multiplexer 30c according to Example 7. In FIG. 22, the description "High" is provided for the pass band of the filter 10f forming the multiplexer 30c, and the description "Low" is provided for the pass band of the filter 10e forming the multiplexer 30c.

The filter 10f includes an acoustic wave resonator, and the multiplexer 30c has a sharp attenuation characteristic in a lower frequency end of the pass band indicated by "High" in FIG. 22 due to a sharp attenuation pole by the acoustic wave resonator. The filter 10e also includes an acoustic wave resonator, and the multiplexer 30c has a sharp attenuation characteristic in a higher frequency end of the pass band indicated by "Low" in FIG. 22 due to a sharp attenuation pole by the acoustic wave resonator. Furthermore, at 1430 MHz, 1880 MHz, 2200 MHz, 2300 MHz, and 2690 MHz, the insertion loss of the multiplexer 30c is as small as 0.81 dB, 0.44 dB, 1.47 dB, 1.44 dB, and 1.15 dB, respectively.

As described above, the multiplexer 30c that has sharp attenuation characteristics and low-loss pass bands can be implemented.

Example 8

Figure 23:
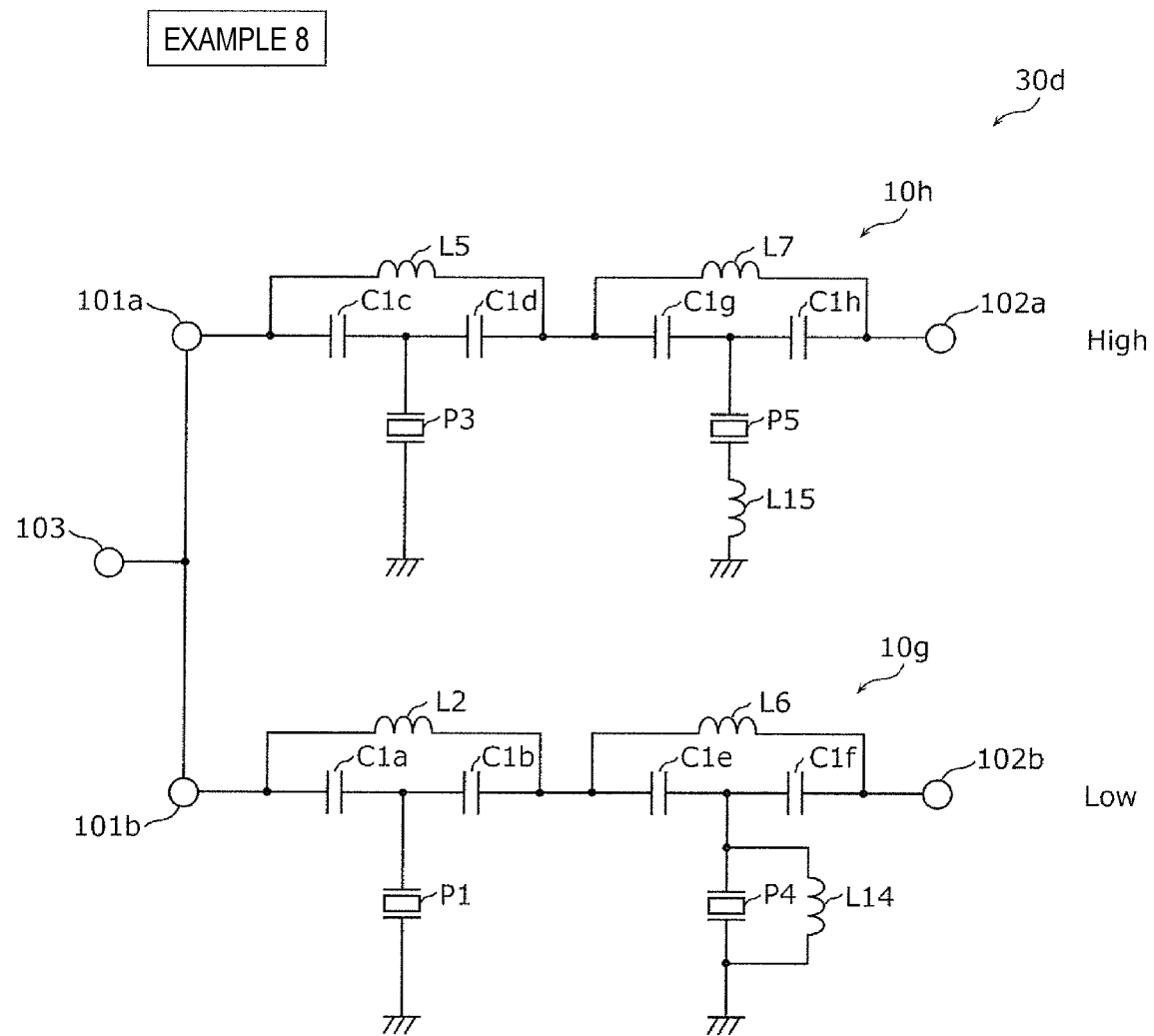
FIG. 23 is a circuit configuration diagram of a multiplexer according to Example 8.

FIG. 23 is a circuit configuration diagram of a multiplexer 30d according to Example 8.

A plurality of filters provided in the multiplexer 30d includes a first filter and a second filter as a combination of filters according to one or more of Examples 1 to 3. Specifically, the multiplexer 30d is a diplexer including filters 10g and 10h, and each of the filters 10g and 10h is a filter in which two filters that are similar to the filter 10 according to Example 1 are connected in series. For example, the filter 10h is a first filter, and the filter 10g is a second filter.

The filter 10g includes capacitors C1a, C1b, C1e, and C1f, inductors L2, L6, and L14, and parallel-arm resonators P1 and P4.

The capacitors C1a and C1b are two first impedance elements that are connected in series on a path connecting the terminal 101b and the terminal 102b.

The inductor L2 is a second impedance element that is connected in parallel with a series circuit including the capacitors C1a and C1b. Specifically, the inductor L2 is connected between a connection point between the capacitor C1a and the terminal 101b and a connection point between the capacitor C1b and the capacitor C1e.

The parallel-arm resonator P1 is an acoustic wave resonator that is connected between the ground and a node between the capacitor C1a and the capacitor C1b on the path connecting the terminal 101b and the terminal 102b.

A filter including the capacitors C1a and C1b, the inductor L2, and the parallel-arm resonator P1 in the filter 10g has a configuration similar to that of the filter 10 according to Example 1.

The capacitors C1e and C1f are two first impedance elements that are connected in series on the path connecting the terminal 101b and the terminal 102b.

The inductor L6 is a second impedance element that is connected in parallel with a series circuit including the capacitors C1e and C1f. Specifically, the inductor L6 is connected between a connection point between the capacitor C1e and the capacitor C1b and a connection point between the capacitor C1f and the terminal 102b.

The parallel-arm resonator P4 is an acoustic wave resonator that is connected between the ground and a node between the capacitor C1e and the capacitor C1f on the path connecting the terminal 101b and the terminal 102b.

The inductor L14 is an inductor that is connected between the node and the ground in parallel with the parallel-arm resonator P4.

A filter including the capacitors C1e and C1f, the inductor L6, and the parallel-arm resonator P4 in the filter 10g has a configuration similar to that of the filter 10 according to Example 1.

The filter 10h includes capacitors C1c, C1d, C1g, and C1h, inductors L5, L7, and L15, and parallel-arm resonators P3 and P5.

The capacitors C1c and C1d are two first impedance elements that are connected in series on a path connecting the terminal 101a and the terminal 102a.

The inductor L5 is a second impedance element that is connected in parallel with a series circuit including the capacitors C1c and C1d. Specifically, the inductor L5 is connected between a connection point between the capacitor C1c and the terminal 101a and a connection point between the capacitor C1d and the capacitor C1g.

The parallel-arm resonator P3 is an acoustic wave resonator that is connected between the ground and a node between the capacitor C1c and the capacitor C1d on the path connecting the terminal 101a and the terminal 102a.

A filter including the capacitors C1c and C1d, the inductor L5, and the parallel-arm resonator P3 in the filter 10h has a configuration similar to that of the filter 10 according to Example 1.

The capacitors C1g and C1h are two first impedance elements that are connected in series on the path connecting the terminal 101a and the terminal 102a.

The inductor L7 is a second impedance element that is connected in parallel with a series circuit including the capacitors C1g and C1h. Specifically, the inductor L7 is connected between a connection point between the capacitor C1g and the capacitor C1d and a connection point between the capacitor C1h and the terminal 102a.

The parallel-arm resonator P5 is an acoustic wave resonator that is connected between the ground and a node between the capacitor C1g and the capacitor C1h on the path connecting the terminal 101a and the terminal 102a.

The inductor L15 is an inductor that is connected between the node and the ground in series with the parallel-arm resonator P5.

A filter including the capacitors C1g and C1h, the inductor L7, and the parallel-arm resonator P5 in the filter 10h has a configuration similar to that of the filter 10 according to Example 1.

In the multiplexer 30d, an input terminal (terminal 101a) of the filter 10h and an input terminal (terminal 101b) of the filter 10g are connected in common to the common terminal 103. The common terminal 103 and each of the terminals 101a and 101b may be connected directly without any other elements interposed therebetween or connected indirectly with other elements interposed therebetween.

For example, the filter 10h is a high pass filter, and the filter 10g is a low pass filter. Furthermore, for example, the pass band of the filter 10h is higher than the pass band of the filter 10g. Accordingly, the multiplexer 30d is able to handle two frequency bands. In FIG. 23, the description "High" provided next to the terminal 102a of the filter 10h and the description "Low" provided next to the terminal 102b of the filter 10g indicate that the pass band of the filter 10h is higher than the pass band of the filter 10g.

Bandpass Characteristics of Multiplexer According to Example 8

Next, bandpass characteristics of the multiplexer 30d according to Example 8 will be explained.

Figure 24:
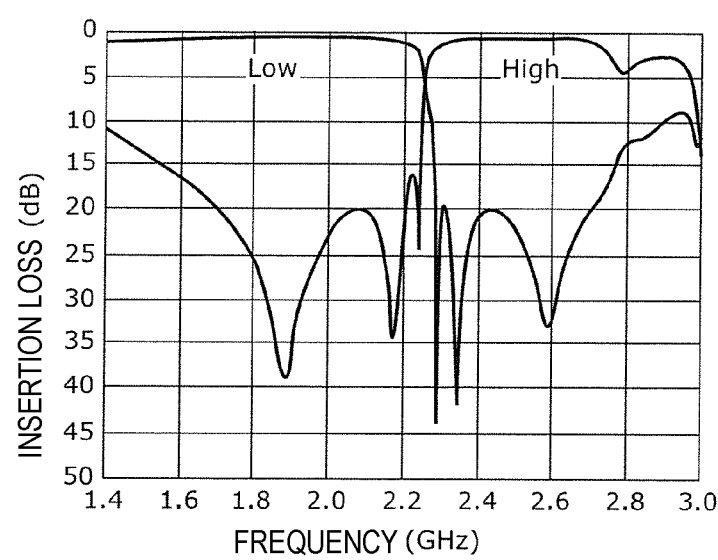
FIG. 24 is a graph indicating bandpass characteristics of the multiplexer according to Example 8.

FIG. 24 is a graph indicating the bandpass characteristics of the multiplexer 30d according to Example 8. In FIG. 24, the description "High" is provided for the pass band of the filter 10h forming the multiplexer 30d, and the description "Low" is provided for the pass band of the filter 10g forming the multiplexer 30d.

The filter 10h includes an acoustic wave resonator and the multiplexer 30d has a sharp attenuation characteristic in a lower frequency end of the pass band indicated by "High" in FIG. 24 due to a sharp attenuation pole by the acoustic wave resonator. Furthermore, the filter 10g also includes an acoustic wave resonator, and the multiplexer 30d has a sharp attenuation characteristic in a higher frequency end of the pass band indicated by "Low" in FIG. 24 due to a sharp attenuation pole by the acoustic wave resonator. At 1430 MHz, 1880 MHz, 2200 MHz, 2300 MHz, and 2690 MHz, the insertion loss of the multiplexer 30d is as small as 0.89 dB, 0.51 dB, 1.21 dB, 1.21 dB, and 0.93 dB, respectively.

As described above, the multiplexer 30d that has sharp attenuation characteristics and low-loss pass bands can be implemented.

Example 9

Figure 25:
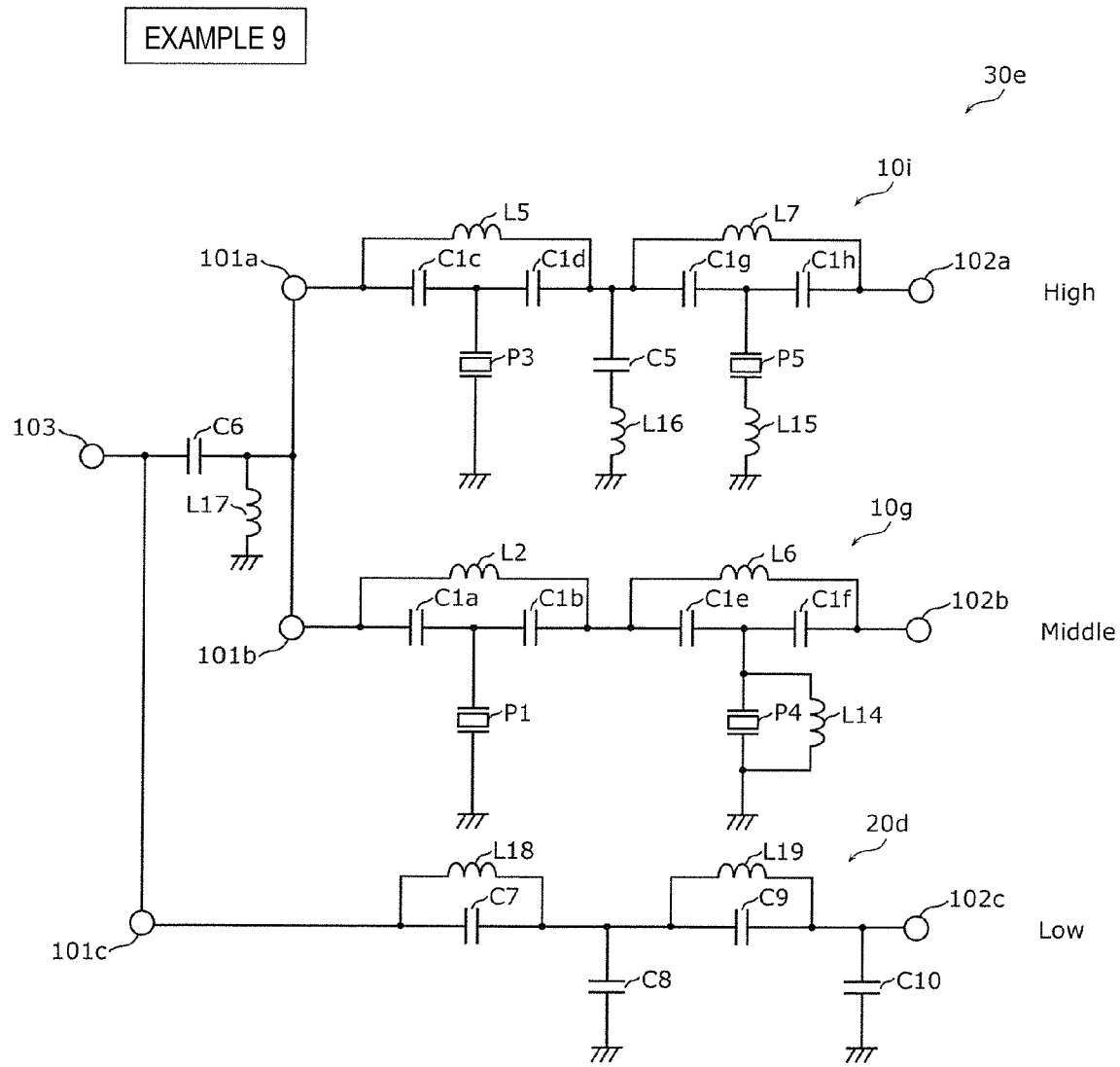
FIG. 25 is a circuit configuration diagram of a multiplexer according to Example 9.

FIG. 25 is a circuit configuration diagram of a multiplexer 30e according to Example 9.

A plurality of filters provided in the multiplexer 30e include a first filter and a second filter as a combination of filters according to one or more of Examples 1 to 3. The multiplexer 30e also includes a low pass filter whose input terminal or output terminal is connected to a common terminal. Specifically, the multiplexer 30e is a triplexer including filters 10g, 10i, and 20d, and each of the filters 10g and 10i is a filter in which two filters that are similar to the filter 10 according to Example 1 are connected in series. The filter 20d is a low pass filter. For example, the filter 10i is a first filter, and the filter 10g is a second filter. The multiplexer 30e further includes a capacitor C6 and an inductor L17.

The filter 10g has the same configuration as that described above in Example 8, and explanation for the filter 10g will be omitted.

The filter 10i includes a capacitor C5 and an inductor L16, in addition to the configuration of the filter 10h described above in Example 8. The configuration of parts other than the capacitor C5 and the inductor L16 is the same as that of the filter 10h, and explanation for those parts will be omitted.

The capacitor C5 is a capacitor that is connected between the ground and a node between the capacitor C1d and the capacitor C1g on a path connecting the terminal 101a and the terminal 102a.

The inductor L16 is an inductor that is connected between the ground and a node between the capacitor C1d and the capacitor C1g on the path connecting between the terminal 101a and the terminal 102a.

The capacitor C5 and the inductor L16 are connected in series.

The filter 20d includes capacitors C7, C8, C9, and C10 and inductors L18 and L19.

The capacitor C7 and the inductor L18 are connected in parallel and form a parallel resonant circuit on a path connecting a terminal 101c and a terminal 102c.

The capacitor C9 and the inductor L19 are connected in parallel and form a parallel resonant circuit on the path connecting the terminal 101c and the terminal 102c.

The capacitor C8 is a capacitor that is connected between the ground and a node between the capacitor C7 and the capacitor C9 on the path connecting the terminal 101c and the terminal 102c.

The capacitor C10 is a capacitor that is connected between the ground and a node between the capacitor C9 and terminal 102c on the path connecting the terminal 101c and the terminal 102c.

The capacitor C6 is a capacitor that is provided on a path connecting the common terminal 103 and the terminal 101a (terminal 101b).

The inductor L17 is an inductor that is connected between the ground and a node between the capacitor C6 and the terminal 101a (terminal 101b) on the path connecting the common terminal 103 and the terminal 101a (terminal 101b).

For example, the capacitor C6 and the inductor L17 form a matching circuit.

In the multiplexer 30e, an input terminal (terminal 101a) of the filter 10i, an input terminal (terminal 101b) of the filter 10g, and an input terminal (terminal 101c) of the filter 20d are connected in common to the common terminal 103. The common terminal 103 and each of the terminals 101a, 101b, and 101c may be connected directly without any other elements interposed therebetween or connected indirectly with other elements interposed therebetween. In FIG. 25, an example in which the common terminal 103 and each of the terminals 101a and 101b are connected indirectly with other elements interposed therebetween is illustrated.

For example, the filter 10i is a high pass filter, the filter 10g is a band pass filter, and the filter 20d is a low pass filter, as described above. Furthermore, for example, the pass band of the filter 10i is higher than the pass band of the filter 10g, and the pass band of the filter 10g is higher than the pass band of the filter 20d. Accordingly, the multiplexer 30e is able to handle three frequency bands. In FIG. 25, the description "High" provided next to the terminal 102a of the filter 10i, the description "Middle" provided next to the terminal 102b of the filter 10g, and the description "Low" provided next to the terminal 102c of the filter 20d indicate that the pass band of the filter 10i is higher than the pass band of the filter 10g and the pass band of the filter 10g is higher than the pass band of the filter 20d.

Bandpass Characteristics of Multiplexer According to Example 9

Next, bandpass characteristics of the multiplexer 30e according to Example 9 will be explained.

Figure 26:
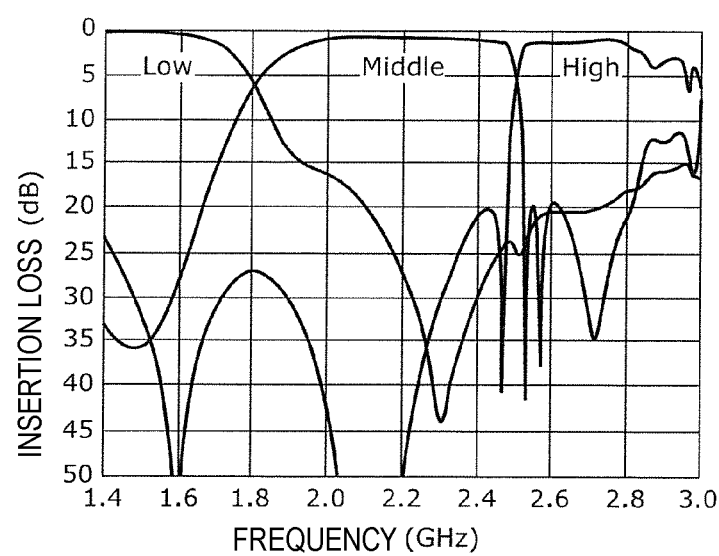
FIG. 26 is a graph indicating bandpass characteristics of the multiplexer according to Example 9.

FIG. 26 is a graph indicating the bandpass characteristics of the multiplexer 30e according to Example 9. In FIG. 26, the description "High" is provided for the pass band of the filter 10i forming the multiplexer 30e, the description "Middle" is provided for the pass band of the filter 10g forming the multiplexer 30e, and the description "Low" is provided for the pass band of the filter 20d forming the multiplexer 30e.

The filter 10i includes an acoustic wave resonator, and the multiplexer 30e has a sharp attenuation characteristic in a lower frequency end of the pass band indicated by "High" in FIG. 26 due to a sharp attenuation pole by the acoustic wave resonator. Furthermore, the filter 10g includes an acoustic wave resonator, and the multiplexer 30e has a sharp attenuation characteristic in a higher frequency end of the pass band indicated by "Middle" in FIG. 26 due to a sharp attenuation pole by the acoustic wave resonator. At 699 MHz, 960 MHz, 1430 MHz, 2200 MHz, 2300 MHz, and 2690 MHz, the insertion loss of the multiplexer 30e is as small as 0.29 dB, 0.73 dB, 1.36 dB, 1.34 dB, 1.45 dB, and 1.45 dB, respectively.

As described above, the multiplexer 30e that has sharp attenuation characteristics and low-loss pass bands can be implemented.

Example 10

Figure 27:
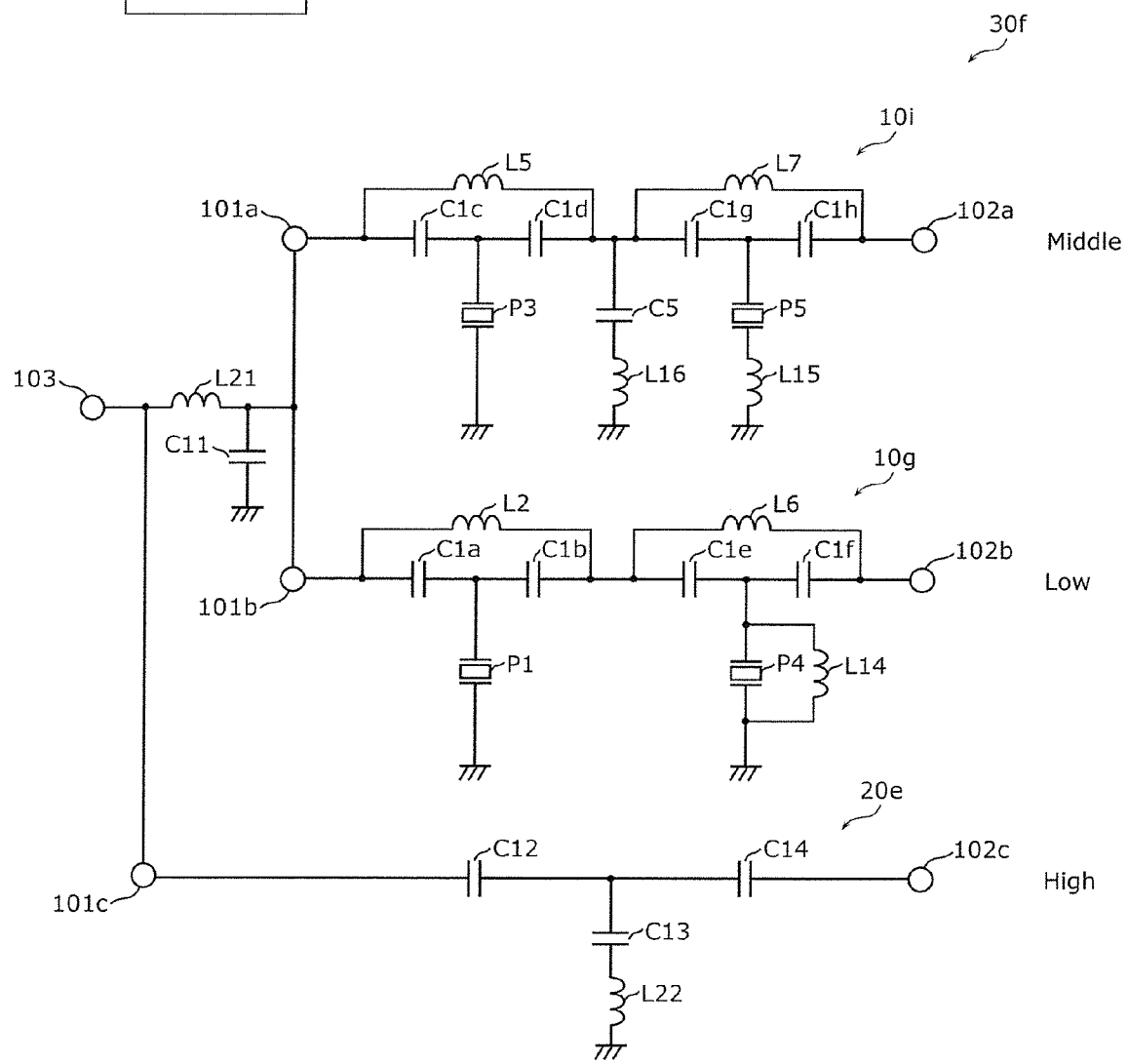
FIG. 27 is a circuit configuration diagram of a multiplexer according to Example 10.

FIG. 27 is a circuit configuration diagram of a multiplexer 30f according to Example 10.

A plurality of filters provided in the multiplexer 30f include a first filter and a second filter as a combination of filters according to one or more of Examples 1 to 3. The multiplexer 30f also includes a high pass filter whose input terminal or output terminal is connected to a common terminal. Specifically, the multiplexer 30f is a triplexer including filters 10g, 10i, and 20e, and each of the filters 10g and 10i is a filter in which two filters that are similar to the filter 10 according to Example 1 are connected in series. The filter 20e is a high pass filter. For example, the filter 10i is a first filter, and the filter 10g is a second filter. The multiplexer 30f further includes a capacitor C11 and an inductor L21.

The filter 10g has the same configuration as that described above in Example 8, and explanation for the configuration of the filter 10g will be omitted. The filter 10i has the same configuration as that described above in Example 9, and explanation for the configuration of the filter 10i will be omitted.

The filter 20e includes capacitors C12, C13, and C14 and an inductor L22.

The capacitors C12 and C14 are connected in series on a path connecting the terminal 101c and the terminal 102c.

The capacitor C13 is a capacitor that is connected between the ground and a node between the capacitor C12 and the capacitor C14 on the path connecting the terminal 101c and the terminal 102c.

The inductor L22 is an inductor that is connected between the ground and the node between the capacitor C12 and the capacitor C14 on the path connecting the terminal 101c and the terminal 102c.

The capacitor C13 and the inductor L22 are connected in series.

The filter 20e may not include the capacitor C13.

The inductor L21 is an inductor that is connected on a path connecting the common terminal 103 and the terminal 101a (terminal 101b).

The capacitor C11 is a capacitor that is connected between the ground and the node between the inductor L21 and the terminal 101a (terminal 101b) on the path connecting the common terminal 103 and the terminal 101a (terminal 101b).

For example, the inductor L21 and the capacitor C11 form a matching circuit.

The multiplexer 30f may not include the inductor L21 or the capacitor C11.

In the multiplexer 30f, an input terminal (terminal 101a) of the filter 10i, an input terminal (terminal 101b) of the filter 10g, and an input terminal (terminal 101c) of the filter 20e are connected in common to the common terminal 103. The common terminal 103 and each of the terminals 101a, 101b, and 101c may be connected directly without any other elements interposed therebetween or connected indirectly with other elements interposed therebetween. In FIG. 27, an example in which the common terminal 103 and each of the terminals 101a and 101b are connected indirectly with other elements interposed therebetween is illustrated.

For example, the filter 10i is a band pass filter, the filter 10g is a low pass filter, and the filter 20e is a high pass filter, as described above. Furthermore, for example, the pass band of the filter 20e is higher than the pass band of the filter 10i, and the pass band of the filter 10i is higher than the pass band of the filter 10g. Accordingly, the multiplexer 30f is able to handle three frequency bands. In FIG. 27, the description "Middle" provided next to the terminal 102a of the filter 10i, the description "Low" provided next to the terminal 102b of the filter 10g, and the description "High" provided next to the terminal 102c of the filter 20e indicate that the pass band of the filter 20e is higher than the pass band of the filter 10i and the pass band of the filter 10i is higher than the pass band of the filter 10g.

Illustration of the bandpass characteristics of the multiplexer 30f according to Example 10 is omitted. Because the multiplexer 30f includes the filters 10g and 10i each including an acoustic wave resonator as in Example 9, the multiplexer 30f that has sharp attenuation characteristics and low-loss pass bands can be implemented.

Example 11

Figure 28:
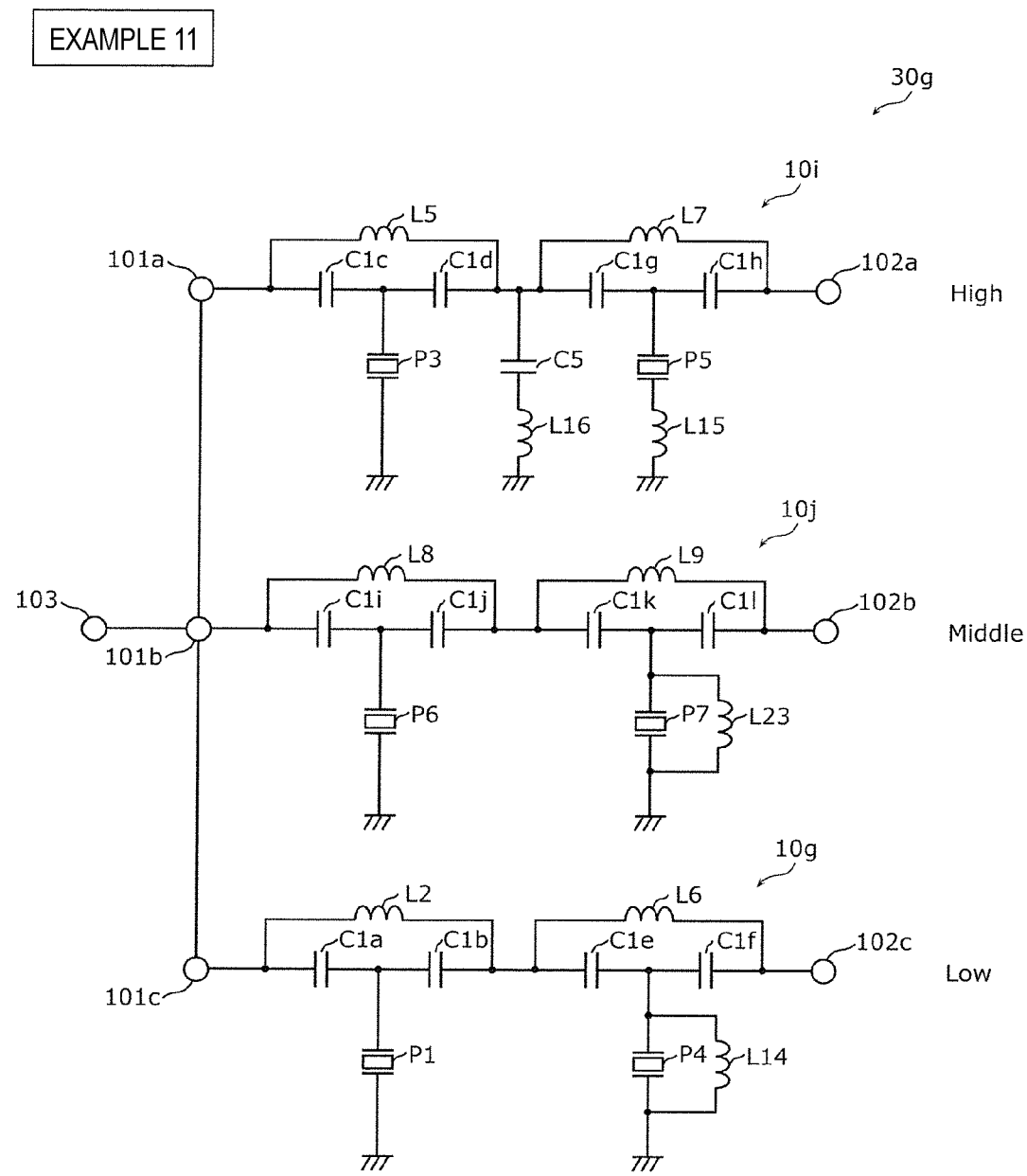
FIG. 28 is a circuit configuration diagram of a multiplexer according to Example 11.

FIG. 28 is a circuit configuration diagram of a multiplexer 30g according to Example 11.

A plurality of filters provided in the multiplexer 30g include a first filter, a second filter, and a fourth filter as a combination of filters according to one or more of Examples 1 to 3. Specifically, the multiplexer 30g is a triplexer including filters 10g, 10i, and 10j, and each of the filters 10g, 10i, 10j is a filter in which two filters that are similar to the filter 10 according to Example 1 are connected in series. For example, the filter 10i is a first filter, the filter 10g is a second filter, and the filter 10j is a fourth filter.

The filter 10i has the same configuration as that described above in Example 9, and explanation for the configuration of the filter 10i will be omitted.

The filter 10g has the same configuration as that described above in Example 8 with the exception that the filter 10g is connected between the terminal 101c and the terminal 102c, and explanation for the configuration of the filter 10g will be omitted.

The filter 10j includes capacitors C1i, C1j, C1k, and C1l, inductors L8, L9, and L23, and parallel-arm resonators P6 and P7.

The capacitors C1i and C1j are two first impedance elements that are connected in series on a path connecting the terminal 101b and the terminal 102b.

The inductor L8 is a second impedance element that is connected in parallel with a series circuit including the capacitors C1i and C1j. Specifically, the inductor L8 is connected between a connection point between the capacitor C1i and the terminal 101b and a connection point between the capacitor C1j and the capacitor C1k.

The parallel-arm resonator P6 is an acoustic wave resonator that is connected between the ground and a node between the capacitors C1i and C1j on the path connecting the terminal 101b and the terminal 102b.

A filter including the capacitors C1i and C1j, the inductor L8, and the parallel-arm resonator P6 in the filter 10g has a configuration similar to that of the filter 10 according to Example 1.

The capacitors C1k and C1l are two first impedance elements that are connected in series on the path connecting the terminal 101b and the terminal 102b.

The inductor L9 is a second impedance element that is connected in parallel with a series circuit including the capacitors C1k and C1l. Specifically, the inductor L9 is connected between a connection point between the capacitor C1k and the capacitor C1j and a connection point between the capacitor C1l and the terminal 102b.

The parallel-arm resonator P7 is an acoustic wave resonator that is connected between the ground and a node between the capacitor C1k and the capacitor C1l on the path connecting the terminal 101b and the terminal 102b.

The inductor L23 is an inductor that is connected between the node and the ground in parallel with the parallel-arm resonator P7.

A filter including the capacitors C1k and C1l, the inductor L9, and the parallel-arm resonator P7 in the filter 10j has a configuration similar to that of the filter 10 according to Example 1.

In the multiplexer 30g, an input terminal (terminal 101a) of the filter 10i, an input terminal (terminal 101b) of the filter 10j, and an input terminal (terminal 101c) of the filter 10g are connected in common to the common terminal 103. The common terminal 103 and each of the terminals 101a, 101b, and 101c may be connected directly without any other elements interposed therebetween or connected indirectly with other elements interposed therebetween.

For example, the filter 10i is a high pass filter, the filter 10j is a band pass filter, and the filter 10g is a low pass filter. Furthermore, for example, the pass band of the filter 10i is higher than the pass band of the filter 10j, and the pass band of the filter 10j is higher than the pass band of the filter 10g. Accordingly, the multiplexer 30g is able to handle three frequency bands. In FIG. 28, the description "High" provided next to the terminal 102a of the filter 10i, the description "Middle" provided next to the terminal 102b of the filter 10j, and the description "Low" provided next to the terminal 102c of the filter 10g indicate that the pass band of the filter 10i is higher than the pass band of the filter 10j and the pass band of the filter 10j is higher than the pass band of the filter 10g.

Bandpass Characteristics of Multiplexer According to Example 11

Next, bandpass characteristics of the multiplexer 30g according to Example 11 will be explained.

Figure 29:
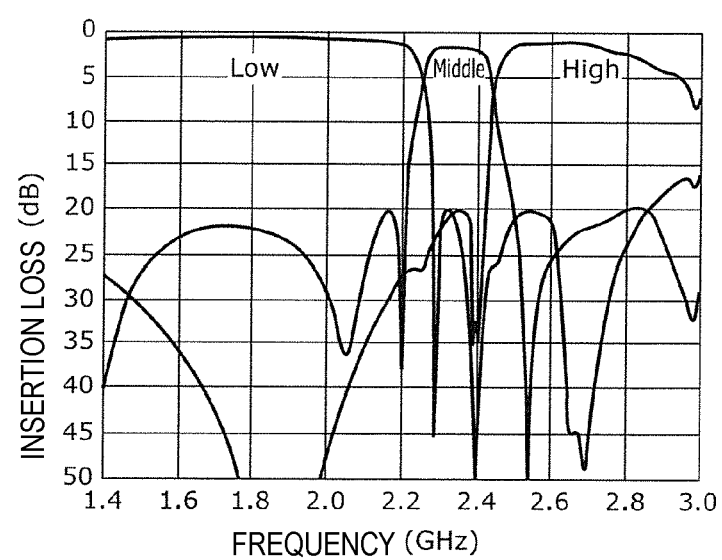
FIG. 29 is a graph indicating bandpass characteristics of the multiplexer according to Example 11.

FIG. 29 is a graph indicating the bandpass characteristics of the multiplexer 30g according to Example 11. In FIG. 29, the description "High" is provided for the pass band of the filter 10i forming the multiplexer 30g, the description "Middle" is provided for the pass band of the filter 10j forming the multiplexer 30g, and the description "Low" is provided for the pass band of the filter 10g forming the multiplexer 30g.

The filter 10i includes an acoustic wave resonator, and the multiplexer 30g has a sharp attenuation characteristic in a lower frequency end of the pass band indicated by "High" in FIG. 29 due to a sharp attenuation pole by the acoustic wave resonator. Furthermore, the filter 10j includes an acoustic wave resonator, and the multiplexer 30g has sharp attenuation characteristics in a higher frequency end and a lower frequency end of the pass band indicated by "Middle" in FIG. 29 due to sharp attenuation poles by the acoustic wave resonator. Moreover, the filter 10g includes an acoustic wave resonator, and the multiplexer 30g has a sharp attenuation characteristic in a higher frequency end of the pass band indicated by "Low" in FIG. 29 due to a sharp attenuation pole by the acoustic wave resonator. At 1430 MHz, 2200 MHz, 2300 MHz, 2400 MHz, 2500 MHz, and 2690 MHz, the insertion loss of the multiplexer 30g is as small as 0.65 dB, 1.34 dB, 1.75 dB, 1.90 dB, 1.59 dB, and 1.25 dB, respectively.

As described above, the multiplexer 30g that has sharp attenuation characteristics and low-loss pass bands can be implemented.

[One-Chip Formation]

An acoustic wave resonator is formed at a substrate having piezoelectricity. Thus, a plurality of acoustic wave resonators can be formed at a single substrate. That is, a plurality of acoustic wave resonators can be formed into one chip. Therefore, a reduction in size can be achieved.

However, in the case where a plurality of acoustic wave resonators are formed into one chip, countermeasures against harmonic waves (unwanted waves) corresponding to resonant frequencies of the individual acoustic wave resonators are required. Accordingly, productivity decreases, and cost increases.

Thus, acoustic wave resonators whose resonant frequencies are within the range of 200 MHz are formed into one chip. Accordingly, harmonic waves generated by acoustic wave resonators formed into one chip are within the range of 200 MHz, and countermeasures against harmonic waves located in close frequency bands can be easily implemented.

For example, the parallel-arm resonators P1 and P3 in the multiplexer 30 according to Example 4 may be formed into one chip. This will be explained below with reference to FIG. 30.

Figure 30:
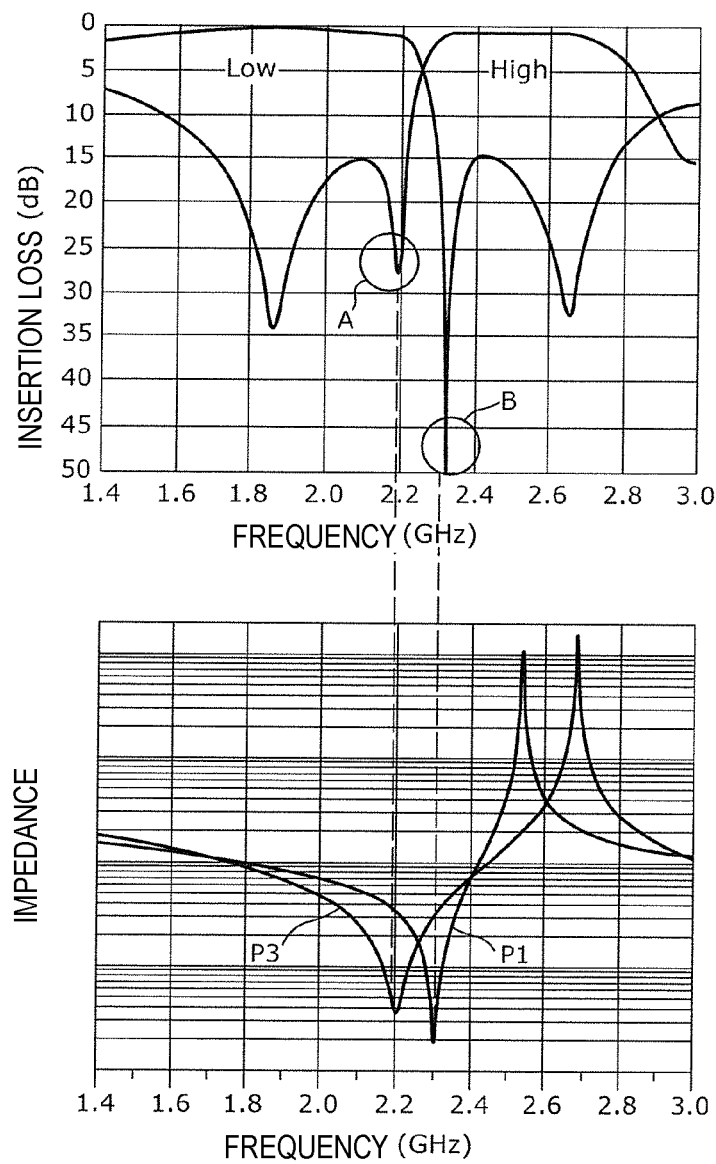
FIG. 30 includes diagrams for explaining a reason why resonators forming the multiplexer according to Example 4 can be formed into one chip.

FIG. 30 includes graphs for explaining a reason why resonators forming the multiplexer 30 according to Example 4 can be formed into one chip. An upper graph in FIG. 30 indicates the bandpass characteristics of the multiplexer 30, and a lower graph in FIG. 30 indicates impedance characteristics of the parallel-arm resonators P1 and P3 forming the multiplexer 30. In the upper graph, the description "High" is provided for the pass band of the filter 10d forming the multiplexer 30, and the description "Low" is provided for the pass band of the filter 10 forming the multiplexer 30. On the vertical axis for the impedance characteristics, an upper side indicates a higher impedance.

An attenuation pole (Part A in FIG. 30) on the lower frequency side of the pass band of the filter 10d corresponds to the resonant frequency of the parallel-arm resonator P3, and an attenuation pole (Part B in FIG. 30) on the higher frequency side of the pass band of the filter 10 corresponds to the resonant frequency of the parallel-arm resonator P1. The resonant frequency of the parallel-arm resonator P1 and the resonant frequency of the parallel-arm resonator P3 are within the range of 200 MHz, as indicated in the lower graph in FIG. 30. Accordingly, even when the parallel-arm resonators P1 and P3 are formed into one chip, frequencies of harmonic waves generated by the parallel-arm resonators P1 and P3 are close to each other, and countermeasures against the harmonic waves can be implemented easily. Thus, the parallel-arm resonators P1 and P3 can be formed into one chip.

Furthermore, for example, resonators in the multiplexer 30b according to Example 6 can be formed into one chip. This will be explained below with reference to FIG. 31.

Figure 31:
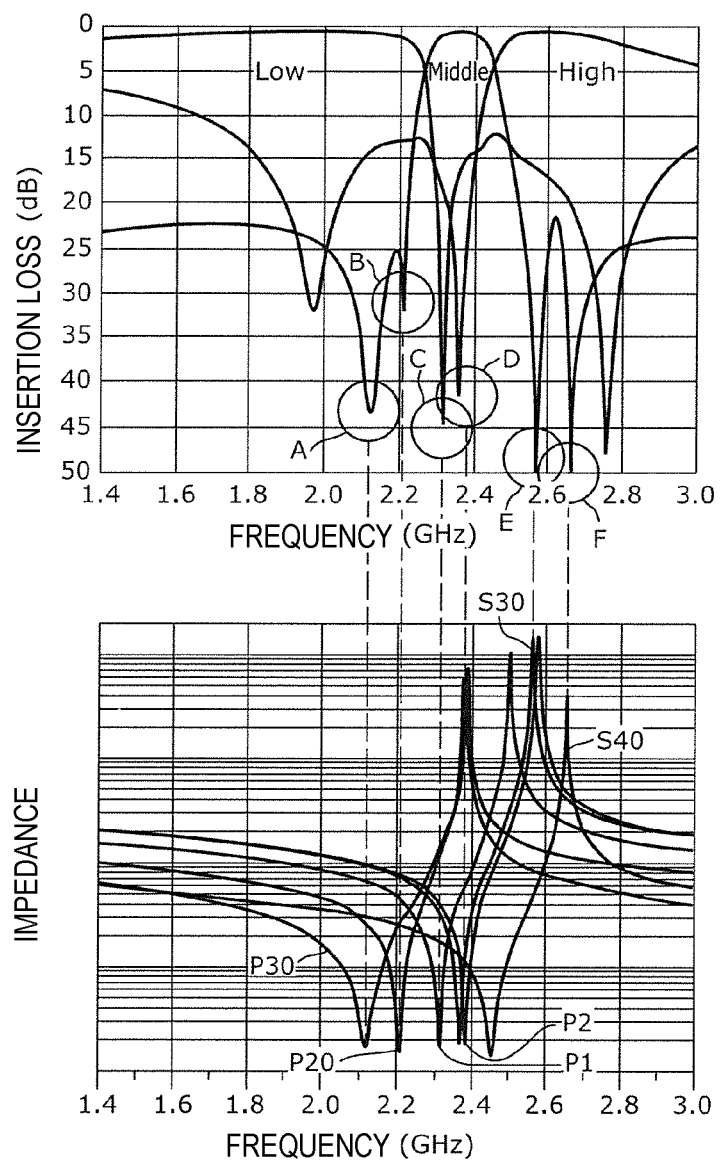
FIG. 31 includes diagrams for explaining a reason why resonators forming the multiplexer according to Example 6 can be formed into one chip.

FIG. 31 includes diagrams for explaining a reason why resonators forming the multiplexer 30b according to Example 6 can be formed into one chip. An upper graph in FIG. 31 indicates the bandpass characteristics of the multiplexer 30b, and a lower graph in FIG. 31 indicates the impedance characteristics of the parallel-arm resonators P1, P2, P20, and P30 and the series-arm resonators S30 and S40 forming the multiplexer 30b. The description "High" is provided for the pass band of the filter 10b forming the multiplexer 30b, the description "Middle" is provided for the pass band of the filter 20c forming the multiplexer 30b, and the description "Low" is provided for the pass band of the filter 10 forming the multiplexer 30b. On the vertical axis for the impedance characteristics, an upper side represents a higher impedance.

Two attenuation poles (Part A and Part B in FIG. 31) on the lower frequency side of the pass band of the filter 20c correspond to the resonant frequencies of the parallel-arm resonators P30 and P20, and an attenuation pole (Part C in FIG. 31) on the higher frequency side of the pass band of the filter 10 corresponds to the resonant frequency of the parallel-arm resonator P1. The resonant frequency of the parallel-arm resonator P30, the resonant frequency of the parallel-arm resonator P20, and the resonant frequency of the parallel-arm resonator P1 are within the range of 200 MHz, as indicated in the lower graph in FIG. 31. Accordingly, even when the parallel-arm resonators P1, P20, and P30 are formed into one chip, frequencies of harmonic waves generated by the parallel-arm resonators P1, P20, and P30 are close to each other, and countermeasures against the harmonic waves can be implemented easily. Thus, the parallel-arm resonators P1, P20, and P30 can be formed into one chip.

An attenuation pole (Part D in FIG. 31) on the lower frequency side of the pass band of the filter 10b corresponds to the resonant frequency of the parallel-arm resonator P2, and two attenuation poles (Part E and Part F in FIG. 31) on the higher frequency side of the pass band of the filter 20c correspond to anti-resonant frequencies of the series-arm resonators S30 and S40. The resonant frequency of the series-arm resonator S30, the resonant frequencies of the parallel-arm resonator P2, and the resonant frequency of the series-arm resonator S40 are within the range of 200 MHz, as indicated in the lower graph in FIG. 31. Accordingly, even when the parallel-arm resonator P2 and the series-arm resonators S30 and S40 are formed into one chip, frequencies of harmonic waves generated by the parallel-arm resonator P2 and the series-arm resonators S30 and S40 are close to each other, and countermeasures against the harmonic waves can be implemented easily. Thus, the parallel-arm resonator P2 and the series-arm resonators S30 and S40 can be formed into one chip.

Similarly, the resonant frequencies of the parallel-arm resonators P1, P2, P3, and P4 in Example 7 are within the range of 200 MHz. Thus, the parallel-arm resonators P1, P2, P3, and P4 can be formed into one chip.

Similarly, the resonant frequencies of the parallel-arm resonators P1, P3, P4, and P5 in Example 8 are within the range of 200 MHz. Thus, the parallel-arm resonators P1, P3, P4, and P5 can be formed into one chip.

Similarly, the resonant frequencies of the parallel-arm resonators P1, P3, P4, and P5 in Example 9 are within the range of 200 MHz. Thus, the parallel-arm resonators P1, P3, P4, and P5 can be formed into one chip.

Similarly, the resonant frequencies of the parallel-arm resonators P1, P3, P4, and P5 in Example 10 are within the range of 200 MHz. Thus, the parallel-arm resonators P1, P3, P4, and P5 can be formed into one chip.

Similarly, the resonant frequencies of the parallel-arm resonators P1, P4, and P6 in Example 11 are within the range of 200 MHz. Thus, the parallel-arm resonators P1, P4, and P6 can be formed into one chip. Furthermore, the resonant frequencies of the parallel-arm resonators P3, P5, and P7 in Example 11 are within the range of 200 MHz. Thus, the parallel-arm resonators P3, P5, and P7 can be formed into one chip.

The structure of a multiplexer in which a plurality of acoustic wave resonators are formed into one chip will be described below with reference to FIG. 32.

Figure 32:
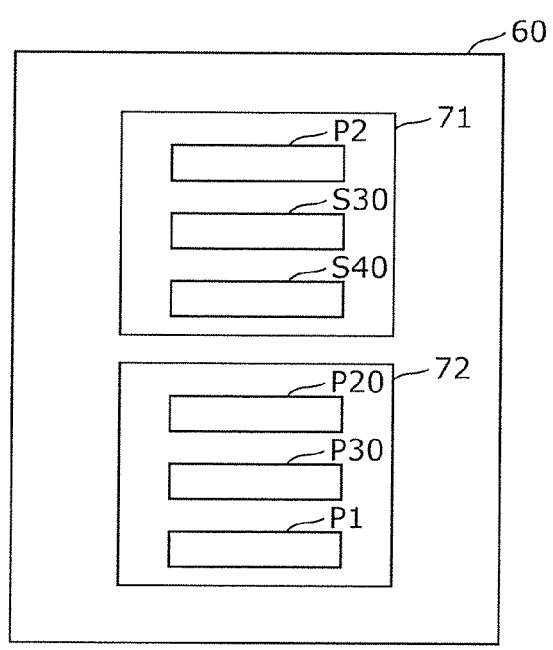
FIG. 32 is a top view schematically illustrating a structure of the multiplexer according to Example 6.

FIG. 32 is a top view schematically illustrating the structure of the multiplexer 30b according to Example 6. In FIG. 32, the parallel-arm resonators P1, P2, P20, and P30 and the series-arm resonators S30 and S40 that are actually formed of IDT electrodes or the like are schematically expressed as rectangles.

The multiplexer 30b is implemented by, for example, a substrate 60 such as a mother board and substrates 71 and 72 having piezoelectricity mounted at the substrate 60. As is clear from FIG. 32, the substrate 71 and the substrate 72 are provided independently. For example, the substrates 71 and 72 may also be called chips. A state in which a plurality of components are formed into one chip represents a state in which the plurality of components are collectively arranged at a single substrate or the plurality of components are formed at a single substrate. A state in which the parallel-arm resonator P2 and the series-arm resonators S30 and S40 are formed into one chip is indicated in FIG. 32 by arranging the parallel-arm resonator P2 and the series-arm resonators S30 and S40, which are schematically illustrated as rectangles, collectively at the substrate 71. Furthermore, a state in which the parallel-arm resonators P1, P20, and P30 are formed into one chip is indicated in FIG. 32 by arranging the parallel-arm resonators P1, P20 and P30, which are schematically illustrated as rectangles, collectively at the substrate 72.

Capacitors and inductors forming the multiplexer 30b may be formed of chip components or wiring patters or the like at a substrate and may be arranged or formed at any of the substrates 60, 71, and 72. Thus, illustration for the capacitors and the inductors are omitted.

In the multiplexer 30b, a combination of acoustic wave resonators formed into one chip is not limited to the above. For example, the parallel-arm resonator P2 in the filter 10b and the series-arm resonators S30 and S40 and the parallel-arm resonators P20 and P30 in the filter 20c may be formed into one chip. Furthermore, for example, the series-arm resonators S30 and S40 and the parallel-arm resonators P20 and P30 in the filter 20c and the parallel-arm resonator P1 in the filter 10 may be formed into one chip. Moreover, the parallel-arm resonator P2 in the filter 10b, the series-arm resonators S30 and S40 and the parallel-arm resonators P20 and P30 in the filter 20c, and the parallel-arm resonator P1 in the filter 10 may be formed into one chip.

As described above, at least one of the parallel-arm resonator P2 provided in the filter 10b and the parallel-arm resonator P1 provided in the filter 10 and at least one of a series-arm resonator and a parallel-arm resonator provided in the filter 20c may be formed into one chip.

[Modifications]

The configuration of a filter according to each of Examples may include other components.

For example, in each of Examples, a capacitor or an inductor may be connected in series with the capacitors C1a and C1b in the filter 10, a capacitor or an inductor may be connected in parallel with the capacitors C1a and C1b, or a capacitor or an inductor may be connected in series with the inductor L2. Furthermore, for example, in each of Examples, a capacitor or an inductor may be connected in series with the inductors L1a and L1b in the filter 10a, a capacitor or an inductor may be connected in parallel with the inductors L1a and L1b, or a capacitor or an inductor may be connected in series or parallel with the capacitor C2.

Furthermore, for example, in each of Examples, a capacitor or an inductor may be connected in series with the parallel-arm resonators P1 and P2, or a capacitor or an inductor may be connected in parallel with the parallel-arm resonators P1 and P2.

Furthermore, for example, in each of Examples, an impedance variable circuit may be connected, in series or parallel with the parallel-arm resonators P1 and P2, between the ground and a node to which the parallel-arm resonators P1 and P2 are connected. The impedance variable circuit will be described below with reference to FIGS. 33 and 34. Explanation will be provided below by attention being paid to a filter according to Example 1. Similar effects can be achieved by applying the impedance variable circuit to the filters according to Examples 2 to 11.

Figure 33:
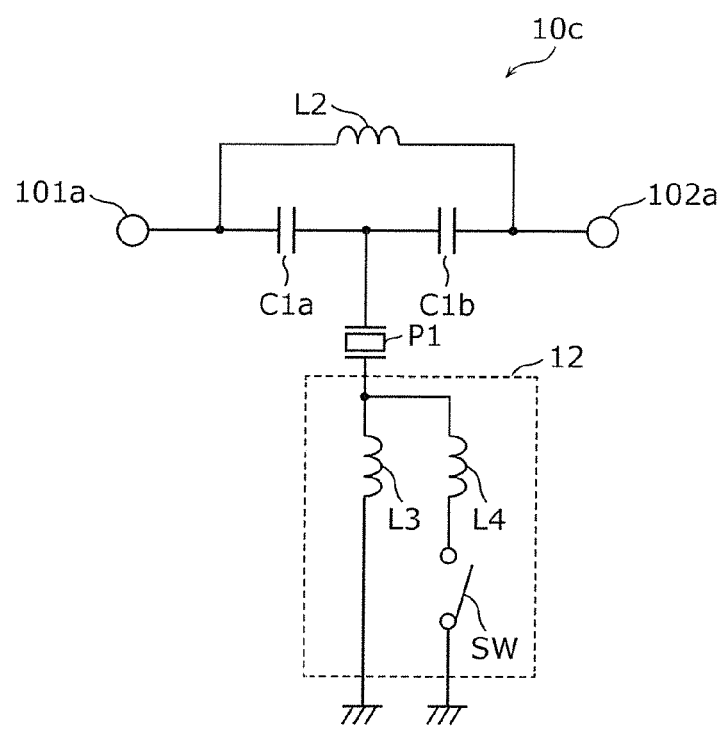
FIG. 33 is a circuit configuration diagram of a filter according to a modification of Example 1.

FIG. 33 is a circuit configuration diagram of a filter 10c according to a modification of Example 1.

The filter 10c includes an impedance variable circuit 12, in addition to the configuration of the filter 10 according to Example 1. The other features of this modification are the same as those of Example 1. Thus, explanation for those features will be omitted.

The impedance variable circuit 12 is, for example, connected, in series with the parallel-arm resonator P1, between the ground and a node to which the parallel-arm resonator P1 is connected. The impedance variable circuit 12 is a circuit for varying the impedance of a parallel arm (that is, a circuit in which the parallel-arm resonator P1 and the impedance variable circuit 12 are connected in series) in the filter 10c. The impedance variable circuit 12 is connected between the parallel-arm resonator P1 and the ground. For example, however, the impedance variable circuit 12 may be connected between the node and the parallel-arm resonator P1.

The impedance variable circuit 12 includes an inductor L3, an inductor L4, and a switch SW. For example, the inductor L4 is connected in series with the switch SW, and the inductor L3 is connected in parallel with the series circuit.

The impedance variable circuit 12 is able to vary the impedance of the parallel arm, specifically, the frequency of an attenuation pole of the parallel arm, in accordance with ON and OFF of the switch SW. In accordance with the frequency of the attenuation pole of the parallel arm varying, the bandpass characteristics of the filter 10c also vary.

Figure 34:
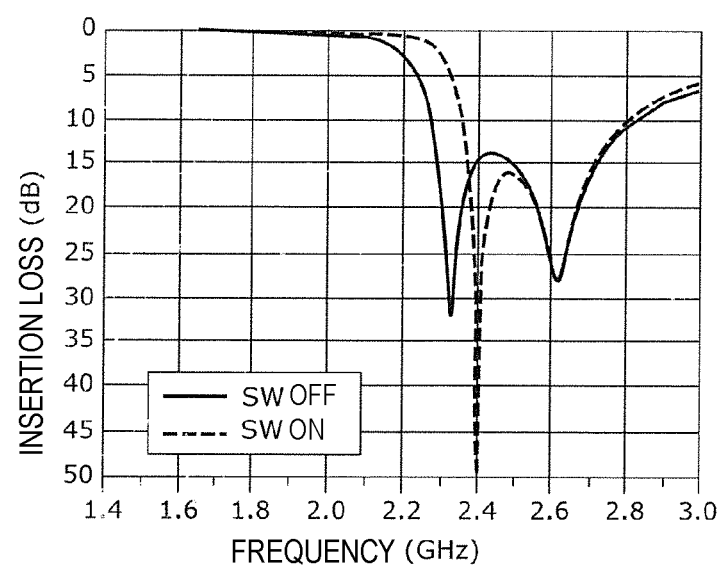

FIG. 34 is a graph indicating the bandpass characteristics of the filter 10c according to the modification of Example 1 when the switch SW is ON and OFF. In FIG. 34, a solid line represents the bandpass characteristics of the filter 10c when the switch SW is OFF, and a broken line represents the bandpass characteristics of the filter 10c when the switch SW is ON.

When the switch SW is ON, the impedance variable circuit 12 functions as a circuit in which the inductor L3 and the inductor L4 are connected in parallel, and due to the influence of the parallel circuit, the higher frequency end of the pass band of the filter 20c can be shifted toward higher frequencies, as illustrated in FIG. 34. In contrast, when the switch SW is OFF, the influence of the inductor L4 becomes negligible in the impedance variable circuit 12, and the higher frequency end of the pass band of the filter 20c can be shifted toward lower frequencies, as illustrated in FIG. 34.

The impedance variable circuit 12 does not necessarily have the circuit configuration illustrated in FIG. 33. The circuit configuration in which the switch SW may vary the number of inductors connected in parallel is provided. For example, however, a circuit configuration in which the switch SW may vary the number of inductors connected in series may be provided. Furthermore, for example, capacitors may be provided in place of the inductors L3 and L4. Depending on the circuit configuration, the higher frequency end of the pass band of the filter 20c may be shifted or the lower frequency end of the pass band of the filter 20c may be shifted.

CONCLUSION

As described above, the radio frequency filter according to the first embodiment includes two first impedance elements that are connected in series on a path connecting an input terminal and an output terminal, a second impedance element that is connected in parallel with a series circuit including the two first impedance elements, and a parallel-arm resonator that is connected between the ground and a node between the two first impedance elements on the path. Each of the first impedance elements is one of a capacitor and an inductor, and the second impedance element is the other one of the capacitor and the inductor.

Accordingly, a low-loss pass band can be achieved compared to a case where a parallel-arm resonator is connected between the ground and a node between one of the two first impedance elements and an input terminal or an output terminal. Furthermore, a low-loss pass band can be achieved compared to a case where an acoustic wave resonator is provided in place of a capacitor as any of the two first impedance elements and the second impedance element. Furthermore, a sharp attenuation characteristic can be achieved by a parallel-arm resonator having a sharp attenuation pole. Accordingly, a radio frequency filter with a sharp attenuation characteristic and a low-loss pass band that is not limited by a resonant band width of an acoustic wave resonator can be implemented.

Furthermore, the radio frequency filter according to the first embodiment may further include a third impedance element that is connected in parallel with one of the two first impedance elements. In the case where the first impedance elements are inductors, the third impedance element may be a capacitor. In the case where the first impedance elements are capacitors, the third impedance element may be an inductor.

Accordingly, for example, by connecting the capacitor C3 in parallel with the inductor L1a as the first impedance element, impedance can be made close to 50Ω in the vicinity of the higher frequency end of the pass band. Thus, insertion loss in the pass band can further be reduced.

Furthermore, the radio frequency filter according to the first embodiment may further include the impedance variable circuit 12 that is connected, in series or parallel with the parallel-arm resonator, between the ground and the node to which the parallel-arm resonator is connected.

Accordingly, with the impedance variable circuit 12, a tunable filter whose pass band can be shifted can be implemented.

Furthermore, the multiplexer according to the first embodiment may include a plurality of filters each including the radio frequency filter according to the first embodiment, and input terminals or output terminals of the plurality of filters may be connected to the common terminal 103.

Accordingly, a multiplexer with sharp attenuation characteristics and low-loss pass bands that are not limited by resonant band widths of acoustic wave resonators can be implemented.

Furthermore, the plurality of filters may include a first filter and a second filter. The first impedance elements provided in the first filter and the first impedance elements provided in the second filter may be capacitors.

Accordingly, for example, a diplexer that has sharp attenuation characteristics and low-loss pass bands that are not limited by resonant band widths of acoustic wave resonators can be implemented.

Furthermore, the multiplexer may further include a low pass filter whose input terminal or output terminal is connected to the common terminal. A pass band of the low pass filter may be lower than a pass band of the first filter and a pass band of the second filter.

Accordingly, for example, a triplexer that has sharp attenuation characteristics and low-loss pass bands that are not limited by resonant band widths of acoustic wave resonators can be implemented.

Furthermore, the multiplexer may further include a high pass filter whose input terminal or output terminal is connected to the common terminal, and a pass band of the high pass filter may be higher than a pass band of the first filter and a pass band of the second filter.

Accordingly, for example, a triplexer that has sharp attenuation characteristics and low-loss pass bands that are not limited by resonant band widths of acoustic wave resonators can be implemented.

Furthermore, parallel-arm resonators provided in the first filter and the second filter may be formed into one chip, and resonant frequencies of the parallel-arm resonators formed into one chip may be within the range of 200 MHz.

Accordingly, the size of the multiplexer may be reduced.

Furthermore, the multiplexer may further include a third filter whose input terminal or output terminal is connected to the common terminal, the third filter may include at least one series-arm resonator and at least one parallel-arm resonator, and a pass band of the third filter may be lower than a pass band of the first filter and higher than a pass band of the second filter.

Accordingly, for example, a triplexer that has sharp attenuation characteristics and low-loss pass bands that are not limited by resonant band widths of acoustic wave resonators can be implemented.

Furthermore, at least one of the parallel-arm resonator provided in the first filter and the parallel-arm resonator provided in the second filter and at least one of the at least one series-arm resonator and the at least one parallel-arm resonator provided in the third filter may be formed into one chip, and resonant frequencies of the resonators formed into one chip may be within the range of 200 MHz.

Accordingly, the size of the multiplexer can be reduced.

Furthermore, the plurality of filters may further include a fourth filter. A pass band of the fourth filter may be lower than a pass band of the first filter and higher than a pass band of the second filter.

Accordingly, for example, a triplexer that has sharp attenuation characteristics and low-loss pass bands that are not limited by resonant band widths of acoustic wave resonators can be implemented.

Furthermore, at least one of the parallel-arm resonator provided in the first filter and the parallel-arm resonator provided in the second filter and the parallel-arm resonator provided in the fourth filter may be formed into one chip, and resonant frequencies of the resonators formed into one chip may be within the range of 200 MHz.

Accordingly, the size of the multiplexer can be reduced.

Furthermore, the multiplexer may include at least two of a filter with a pass band including 699 MHz to 960 MHz, a filter with a pass band including 1.2 GHz, a filter with a pass band including 1.4 GHz to 5 GHz, and a filter with a pass band including 5 GHz to 7.125 GHz.

Furthermore, the multiplexer may include at least two of a filter with a pass band including 699 MHz to 2.7 GHz, a filter with a pass band including 3.3 GHz to 4.2 GHz, a filter with a pass band including 4.4 GHz to 5 GHz, and a filter with a pass band including 5 GHz to 7.125 GHz.

Second Embodiment

The multiplexers described above according to Examples 4 to 11 in the first embodiment may be applied to a radio frequency front end circuit or a communication apparatus.

First, a radio frequency front end circuit that includes the multiplexer 30 described above in the first embodiment will be described with reference to FIG. 35.

Figure 35:
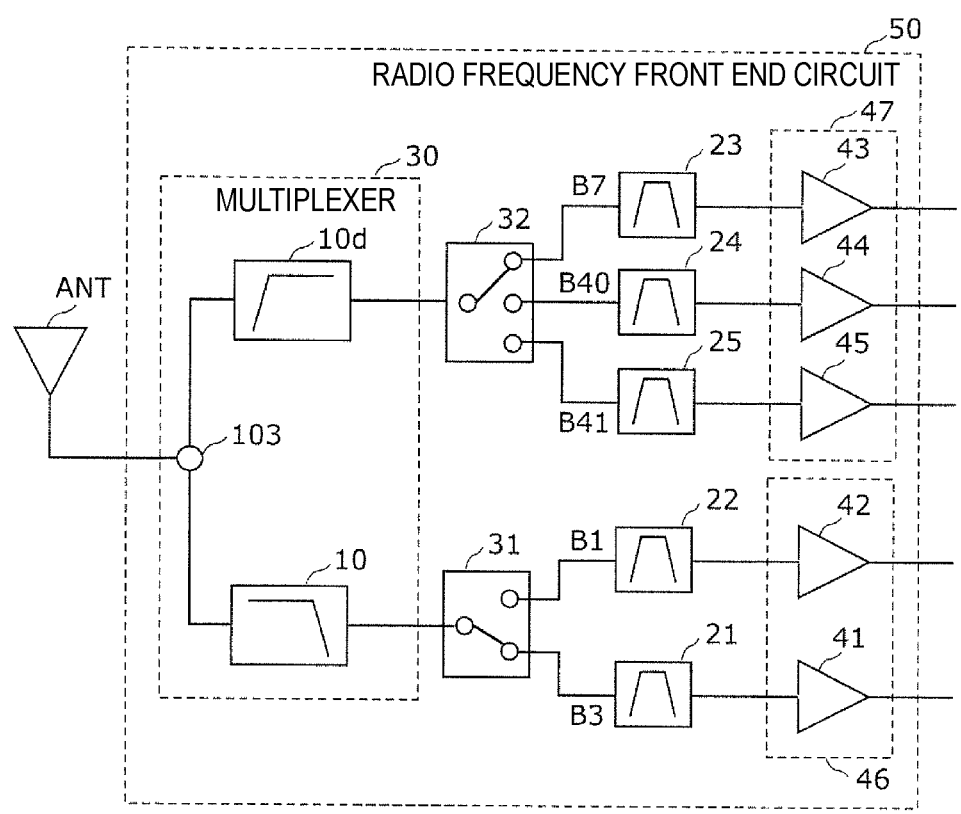
FIG. 35 is a circuit configuration diagram of a radio frequency front end circuit according to a second embodiment.

FIG. 35 is a circuit configuration diagram of a radio frequency front end circuit 50 according to a second embodiment. As illustrated in FIG. 35, the radio frequency front end circuit 50 is a reception-system front end circuit and includes the multiplexer 30, switches 31 and 32, filters 21, 22, 23, 24 and 25, and reception amplifiers 41, 42, 43, 44, and 45. In FIG. 35, an antenna element ANT is illustrated. The antenna element ANT is a multiband antenna conforming to communication standards such as LTE, and transmits and receives radio frequency signals. The antenna element ANT and the radio frequency front end circuit 50 are arranged, for example, in a front end unit of a cellular phone with multimode/multiband capability.

As described above, the multiplexer 30 includes the filter 10d (high pass filter) and the filter 10 (low pass filter).

The filter 10 is a low pass filter with a pass band of a low-band frequency range (for example, from 1427 MHz to 2200 MHz) and with an attenuation band of a high-band frequency range. The filter 10d is a high pass filter with a pass band of a high-band frequency range (for example, from 2300 MHz to 2690 MHz) and with an attenuation band of a low-band frequency range. At least one of the filters 10 and 10d may be a tunable filter.

The switch 31 is a switch element that includes a common terminal and two selection terminals, and the common terminal is connected to the filter 10. The switch 31 is a switch circuit of an SPDT type in which the common terminal may be connected to one of the two selection terminals.

The switch 32 is a switch element that includes a common terminal and three selection terminals, and the common terminal is connected to the filter 10d. The switch 32 is a switch circuit of an SP3T type in which the common terminal may be connected to one of the three selection terminals.

The filter 21 is a band pass filter that is connected to a selection terminal of the switch 31, and the pass band of the filter 21 is, for example, LTE Band 3 (reception band: from 1805 MHz to 1880 MHz). The filter 22 is a band pass filter that is connected to a selection terminal of the switch 31, and the pass band of the filter 22 is, for example, LTE Band 1 (reception band: from 2110 MHz to 2170 MHz). The filter 23 is a band pass filter that is connected to a selection terminal of the switch 32, and the pass band of the filter 23 is, for example, LTE Band 7 (reception band: from 2620 MHz to 2690 MHz). The filter 24 is a band pass filter that is connected to a selection terminal of the switch 32, and the pass band of the filter 24 is, for example, LTE Band 40 (reception band: from 2300 MHz to 2400 MHz). The filter 25 is a band pass filter that is connected to a selection terminal of the switch 32, and the pass band of the filter 25 is, for example, LTE Band 41 (reception band: from 2496 MHz to 2690 MHz).

The reception amplifier 41 is connected to the filter 21, the reception amplifier 42 is connected to the filter 22, the reception amplifier 43 is connected to the filter 23, the reception amplifier 44 is connected to the filter 24, and the reception amplifier 45 is connected to the filter 25. Each of the reception amplifiers 41 to 45 is, for example, a low noise amplifier including a transistor or the like. The reception amplifiers 41 and 42 form an amplifying circuit 46. The reception amplifiers 43 to 45 form an amplifying circuit 47. Each of the amplifying circuits 46 and 47 may be composed of a reception amplifier. In this case, an SPDT switch is arranged between the amplifying circuit 46 and the filters 21 and 22, and an SP3T switch is arranged between the amplifying circuit 47 and the filters 23 to 25.

As described above, the radio frequency front end circuit 50 includes the multiplexer 30 according to the first embodiment, the switches 31 and 32 that are connected directly or indirectly to the multiplexer 30, and the amplifying circuits 46 and 47 that are connected directly or indirectly to the multiplexer 30.

With the configuration of the radio frequency front end circuit 50 described above that includes the multiplexer according to the first embodiment, a radio frequency front end circuit with a sharp attenuation characteristic and a low-loss pass band that is not limited by a resonant band width of an acoustic wave resonator can be implemented.

Next, a radio frequency front end circuit that includes the multiplexer 30b described above according to the first embodiment and a communication apparatus will be described with reference to FIG. 36.

Figure 36:
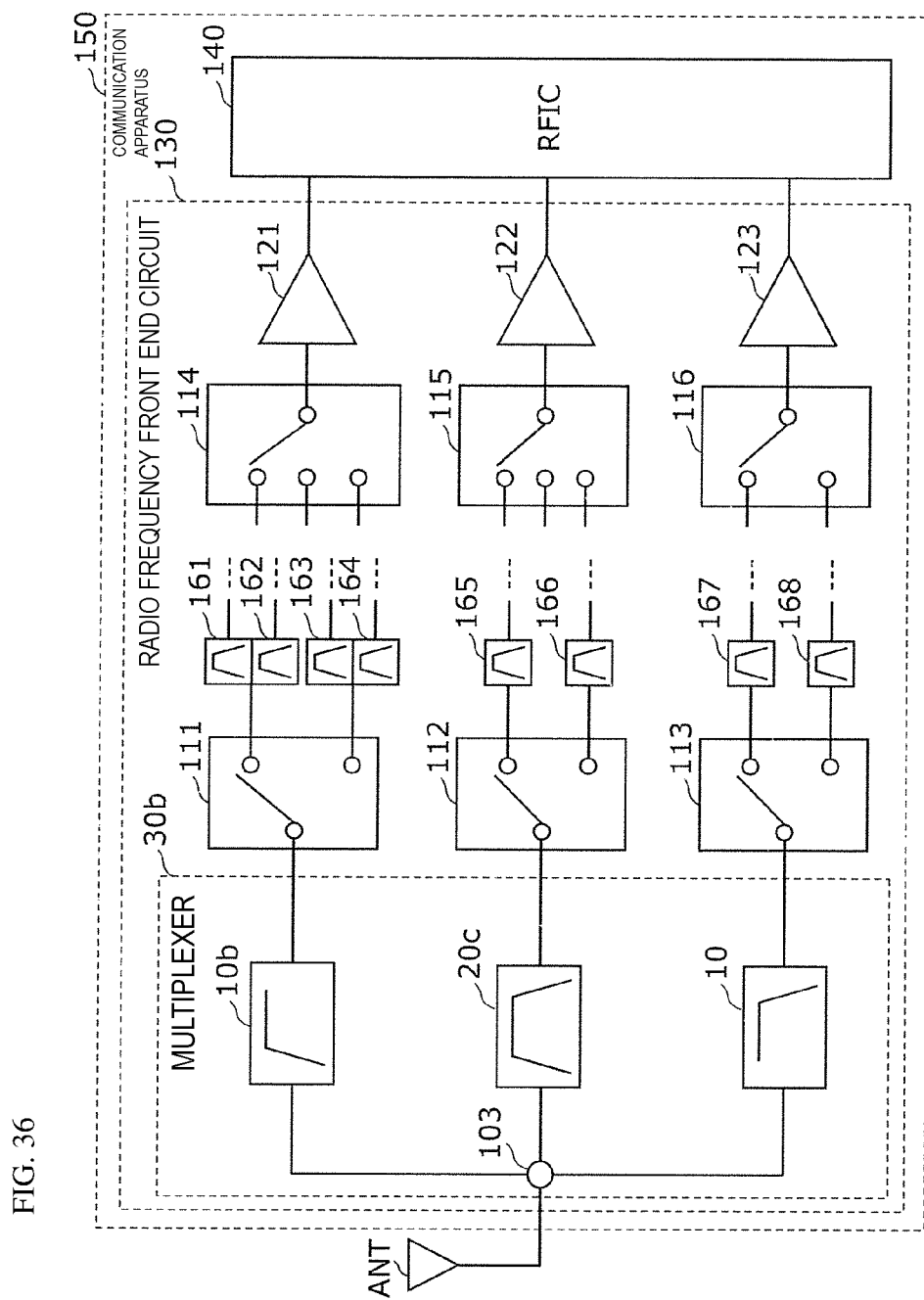
FIG. 36 is a circuit configuration diagram of a communication apparatus according to the second embodiment.

FIG. 36 is a circuit configuration diagram of a communication apparatus 150 according to the second embodiment.

As illustrated in FIG. 36, the communication apparatus 150 includes a radio frequency front end circuit 130 and an RF signal processing circuit (RFIC) 140. In FIG. 36, an antenna element ANT is illustrated. The antenna element ANT may be built in the communication apparatus 150.

The radio frequency front end circuit 130 is a circuit that transmits a radio frequency signal between the antenna element ANT and the RFIC 140. Specifically, the radio frequency front end circuit 130 transmits a radio frequency signal (in this case, a radio frequency reception signal), which is received at the antenna element ANT, via a reception-side signal path to the RFIC 140.

The radio frequency front end circuit 130 includes the multiplexer 30b according to the first embodiment, switches 111 to 116, amplifying circuits 121 to 123, and band pass filters (BPFs) 161 to 168. The BPFs 161 and 162 form a duplexer, and the BPFs 163 and 164 form a duplexer.

As described above, the multiplexer 30b includes the filter 10b (high pass filter), the filter 20c (band pass filter), and the filter 10 (low pass filter).

The filter 10 is a low pass filter with a pass band of a low-band frequency range (for example, from 1427 MHz to 2200 MHz) and with an attenuation band of middle-band and high-band frequency ranges. The filter 20c is a band pass filter with a pass band of a middle-band frequency range (for example, from 2300 MHz to 2400 MHz) and with an attenuation band of low-band and high-band frequency ranges. The filter 10b is a high pass filter with a pass band of a high-band frequency range (for example, from 2496 MHz to 2690 MHz) and with an attenuation band of low-band and middle-band frequency ranges. At least one of the filters 10, 20c, and 10b may be a tunable filter.

The switches 111 to 113 are connected between the multiplexer 30b and the BPFs 161 to 168 and allow signal paths corresponding to low bands, middle bands, and high bands to be connected to the BPFs 161 to 168 in accordance with control signals from a controller (not illustrated in FIG. 36).

Specifically, a common terminal of the switch 111 is connected to the filter 10b, and selection terminals of the switch 111 are connected to the BPFs 161 to 164. A common terminal of the switch 112 is connected to the filter 20c, and selection terminals of the switch 112 are connected to the BPFs 165 and 166. A common terminal of the switch 113 is connected to the filter 10, and selection terminals of the switch 113 are connected to the BPFs 167 and 168.

The switches 114 to 116 are connected between the amplifying circuits 121 to 123 and the BPFs 161 to 168 and allow the BPFs 161 to 168 to be connected to the amplifying circuits 121 to 123 in accordance with control signals from a controller (not illustrated in FIG. 36).

Specifically, a common terminal of the switch 114 is connected to the amplifying circuit 121, and selection terminals of the switch 114 are connected to the BPFs 161 to 164. A common terminal of the switch 115 is connected to the amplifying circuit 122, and selection terminals of the switch 114 are connected to the BPFs 165 and 166. A common terminal of the switch 116 is connected to the amplifying circuit 123, and selection terminals of the switch 116 are connected to the BPFs 167 and 168.

The pass band (from 2496 MHz to 2690 MHz) of the filter 10b includes pass bands of the BPFs 161 to 164. The pass band (from 2300 MHz to 2400 MHz) of the filter 20c includes pass bands of the BPFs 165 and 166. The pass band (from 1427 MHz to 2200 MHz) of the filter 10 includes pass bands of the BPFs 167 and 168.

The amplifying circuits 121 to 123 are, for example, low noise amplifiers that are connected to the multiplexer 30b with the switches 111 to 116 and the BPFs 161 to 168 interposed therebetween and electronically amplify radio frequency reception signals received at the antenna element ANT.

The RFIC 140 is an RF signal processing circuit that processes a radio frequency signal transmitted and received through the antenna element ANT. Specifically, the RFIC 140 performs signal processing, via down conversion or the like, on a radio frequency signal (in this case, a radio frequency reception signal) inputted via a reception-side signal path of the radio frequency front end circuit 130 through the antenna element ANT, and outputs the reception signal generated by the signal processing to a baseband signal processing circuit (not illustrated in FIG. 36).

The radio frequency front end circuit 130 may include a transmission-side signal path and may transmit a radio frequency signal (in this case, a radio frequency transmission signal) outputted from the RFIC 140, via the transmission-side signal path to the antenna element ANT. In this case, the RFIC 140 may perform signal processing, via up conversion or the like, on a transmission signal inputted from the baseband signal processing circuit and output the radio frequency signal (in this case, a radio frequency transmission signal) generated by the signal processing to the transmission-side signal path of the radio frequency front end circuit 130, and the amplifying circuits 121 to 123 may be power amplifiers that electronically amplify radio frequency transmission signals outputted from the RFIC 140.

Although not illustrated in FIG. 36, the controller may be provided in the RFIC 140, or the controller and a switch controlled by the controller may form a switch IC.

With the configuration of the radio frequency front end circuit 130 and the communication apparatus 150 described above that includes the multiplexer according to the first embodiment, a radio frequency front end circuit and a communication apparatus with a sharp attenuation characteristic and a low-loss pass band that is not limited by a resonant band width of an acoustic wave resonator can be implemented.

Other Embodiments

A radio frequency filter, a multiplexer, a radio frequency front end circuit, and a communication apparatus according to embodiments of the present disclosure have been described above. However, the present disclosure is not limited to the embodiments described above. Other embodiments implemented by combining any components in the embodiments described above, modifications obtained by making various changes to the embodiments described above conceived by those skilled in the art without departing from the scope of the present disclosure, and various types of equipment in which a radio frequency filter, a multiplexer, a radio frequency front end circuit, and a communication apparatus according to the present disclosure are built may also be included in the present disclosure.

The number of acoustic wave resonators in the embodiments described above is not limited to one. A plurality of divided resonators obtained by dividing a resonator may be provided.

Furthermore, for example, an inductor or a capacitor may be connected between components in a radio frequency filter, a multiplexer, a radio frequency front end circuit, and a communication apparatus. The inductor may include a wiring inductor serving as wiring connecting the components.

Furthermore, in the embodiments described above, a multiplexer is used to demultiplex an input radio frequency signal. However, the multiplexer may be used to multiplex radio frequency signals.

Furthermore, in the embodiments described above, a plurality of filters provided in a multiplexer include two or more filters according to one or more of Examples 1 to 3. However, the plurality of filters may include at least one of the filters according to Examples 1 to 3.

Furthermore, in the embodiments described above, a diplexer including two filters or a triplexer including three filters is provided as a multiplexer. However, the multiplexer may include four or more filters.

Furthermore, in the second embodiment, a radio frequency front end circuit includes both a switch and an amplifying circuit. However, the radio frequency front end circuit may not include a switch or an amplifying circuit.

The present disclosure may be widely used, as a radio frequency filter, a multiplexer, a front end circuit, and a communication apparatus that may be applicable to a multiband system, for communication equipment such as a mobile phone.

10, 10a, 10b, 10c, 10d, 10e, 10f, 10g, 10h, 10i, 10j, 20, 20a, 20b, 20c, 20d, 21, 22, 23, 24, and 25: filter (radio frequency filter)
11: LC resonant circuit
12: impedance variable circuit
30, 30a, 30b, 30c, 30d, 30e, 30f, 30g, 40, and 40a: multiplexer
31, 32, 111, 112, 113, 114, 115, and 116: SW switch
41, 42, 43, 44, and 45: reception amplifier
46, 47, 121, 122, and 123: amplifying circuit
50 and 130: radio frequency front end circuit
60, 71, and 72: substrate
101a, 101b, and 101c: terminal (input terminal)
102a, 102b, and 102c: terminal (output terminal)
103: common terminal
140: RF signal processing circuit (RFIC)
150: communication apparatus
161, 162, 163, 164, 165, 166, 167, and 168: band pass filter (BPF)
ANT: antenna element
C1a, C1b, C1c, C1d, C1e, C1f, C1g, C1h, C1i, C1j, C1k, and C1l: capacitor (first impedance element)
C2 and C4: capacitor (second impedance element)
C3, C5, C6, C7, C8, C9, C10, C11, C12, C13, and C14: capacitor
L1a, L1b, L1c, and L1d: inductor (first impedance element)
L2, L5, L6, L7, L8, and L9: inductor (second impedance element)
L3, L4, L10, L11, L12, L13, L14, L15, L16, L17, L18, L19, L20, L21, L22, and L23: inductor
N: node
P1, P1a, P2, P3, P4, P5, P6, P7, P10, P11, P20, and P30: parallel-arm resonator
S10, S11, S20, S21, S30, and S40: series-arm resonator

What is claimed is:

1. A multiplexer comprising:
a plurality of filters including a first filter and a second filter, each of the first filter and the second filter including a radio frequency filter, the radio frequency filter comprising:
two first impedance elements that are connected in series on a path connecting an input terminal and an output terminal;
a second impedance element that is connected in parallel with a series circuit including the two first impedance elements; and
a parallel-arm resonator that is connected between a ground and a node between the two first impedance elements on the path connecting the input terminal and the output terminal, wherein
each of the two first impedance elements is one of a capacitor or an inductor, and
the second impedance element is the other one of the capacitor or the inductor; and wherein input terminals or output terminals of the plurality of filters are connected to a common terminal,
a low pass filter whose input terminal or output terminal is connected to the common terminal,
the two first impedance elements provided in the first filter and the two first impedance elements provided in the second filter are capacitors, and
a pass band of the low pass filter is lower than a pass band of the first filter and a pass band of the second filter.

2. The multiplexer according to claim 1,
wherein the radio frequency filter of each of the first and second filters further comprises:
a third impedance element that is connected in parallel with one of the two first impedance elements,
wherein in a case where the two first impedance elements are inductors, the third impedance element is a capacitor, and
wherein in a case where the two first impedance elements are capacitors, the third impedance element is an inductor.

3. The multiplexer according to claim 1,
wherein the radio frequency filter of each of the first and second filters further comprises:
an impedance variable circuit that is connected between the node between the two first impedance elements and the ground in series or in parallel with the parallel-arm resonator.

4. A radio frequency front end circuit comprising:
the multiplexer according to claim 1;
a switch that is connected directly or indirectly to the multiplexer; and
an amplifying circuit that is connected directly or indirectly to the multiplexer.

5. A communication apparatus comprising:
an RF signal processing circuit that processes a radio frequency signal transmitted and received at an antenna element; and
the radio frequency front end circuit according to claim 4 that transmits the radio frequency signal between the antenna element and the RF signal processing circuit.

6. The multiplexer according to Claim 1,
wherein the two first impedance elements provided in the first filter are capacitors and the two first impedance elements provided in the second filter are inductors.

7. The multiplexer according to claim 6, further comprising:
a third filter whose input terminal or output terminal is connected to the common terminal,
wherein the third filter includes at least one series-arm resonator and at least one parallel-arm resonator, and
wherein a pass band of the third filter is lower than the pass band of the first filter and higher than the pass band of the second filter.

8. The multiplexer according to claim 7,
wherein the at least one series-arm resonator is connected in series on a path connecting the common terminal and the output terminal of the third filter.

9. The multiplexer according to claim 7,
wherein the at least one parallel-arm resonator is connected between the ground and a node between the at least one series-arm resonator and the output terminal of the third filter.

10. The multiplexer according to Claim 1, further comprising:
a third filter whose input terminal or output terminal is connected to the common terminal,
wherein the third filter includes at least one series-arm resonator and at least one parallel-arm resonator, and
wherein a pass band of the third filter is lower than the pass band of the first filter and higher than the pass band of the second filter.

11. The multiplexer according to claim 10,
wherein at least one of the parallel-arm resonator provided in the first filter and the parallel-arm resonator provided in the second filter and at least one of the at least one series-arm resonator and the at least one parallel-arm resonator provided in the third filter are provided into one chip, and
wherein resonant frequencies of the resonators provided into the one chip are within a range of 200 MHz.

12. The multiplexer according to claim 1,
wherein the plurality of filters further include a fourth filter,
wherein a pass band of the fourth filter is lower than the pass band of the first filter and higher than the pass band of the second filter.

13. The multiplexer according to claim 12,
wherein at least one of the parallel-arm resonator provided in the first filter and the parallel-arm resonator provided in the second filter and the parallel-arm resonator provided in the fourth filter are provided into one chip, and
wherein resonant frequencies of the resonators provided into the one chip are within a range of 200 MHz.

14. The multiplexer according to claim 1, comprising at least two of:
a filter with a pass band including 699 MHz to 960 MHz,
a filter with a pass band including 1.2 GHz,
a filter with a pass band including 1.4 GHz to 5 GHz, and
a filter with a pass band including 5 GHz to 7.125 GHz.

15. The multiplexer according to claim 1, comprising at least two of:
a filter with a pass band including 699 MHz to 2.7 GHz,
a filter with a pass band including 3.3 GHz to 4.2 GHz,
a filter with a pass band including 4.4 GHz to 5 GHz, and
a filter with a pass band including 5 GHz to 7.125 GHz.

16. A multiplexer comprising:
a plurality of filters including a first filter and a second filter, each of the first filter and the second filter including a radio frequency filter, the radio frequency filter comprising:
two first impedance elements that are connected in series on a path connecting an input terminal and an output terminal;
a second impedance element that is connected in parallel with a series circuit including the two first impedance elements; and
a parallel-arm resonator that is connected between a ground and a node between the two first impedance elements on the path connecting the input terminal and the output terminal, wherein
each of the two first impedance elements is one of a capacitor or an inductor, and
the second impedance element is the other one of the capacitor or the inductor; and wherein input terminals or output terminals of the plurality of filters are connected to a common terminal,
a high pass filter whose input terminal or output terminal is connected to the common terminal,
the two first impedance elements provided in the first filter and the two first impedance elements provided in the second filter are capacitors, and
a pass band of the high pass filter is higher than a pass band of the first filter and a pass band of the second filter.

17. A multiplexer comprising:
a plurality of filters including a first filter and a second filter, each of the first filter and the second filter including a radio frequency filter, the radio frequency filter comprising:
two first impedance elements that are connected in series on a path connecting an input terminal and an output terminal;
a second impedance element that is connected in parallel with a series circuit including the two first impedance elements; and
a parallel-arm resonator that is connected between a ground and a node between the two first impedance elements on the path connecting the input terminal and the output terminal; wherein
each of the two first impedance elements is one of a capacitor or an inductor,
the second impedance element is the other one of the capacitor or the inductor, and wherein
input terminals or output terminals of the plurality of filters are connected to the common terminal,
the two first impedance elements provided in the first filter and the two first impedance elements provided in the second filter are capacitors,
the parallel-arm resonators provided in the first filter and the second filter are provided into one chip, and
resonant frequencies of the parallel-arm resonators provided into the one chip are within a range of 200 MHz.

* * * * *